(12) United States Patent
Vasen

(10) Patent No.: US 10,879,469 B1
(45) Date of Patent: Dec. 29, 2020

(54) METHOD OF MANUFACTURING A FIELD EFFECT TRANSISTOR USING NANOTUBE STRUCTURES AND A FIELD EFFECT TRANSISTOR

(71) Applicant: TAIWAN SEMICONDUCTOR MANUFACTURING CO., LTD., Hsinchu (TW)

(72) Inventor: Timothy Vasen, Tervuren (BE)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/457,385

(22) Filed: Jun. 28, 2019

(51) Int. Cl.
*H01L 51/00* (2006.01)
*H01L 51/05* (2006.01)
*H01L 51/10* (2006.01)

(52) U.S. Cl.
CPC ........ *H01L 51/0048* (2013.01); *H01L 51/055* (2013.01); *H01L 51/0525* (2013.01); *H01L 51/0529* (2013.01); *H01L 51/0541* (2013.01); *H01L 51/0558* (2013.01)

(58) Field of Classification Search
CPC ............. H01L 51/0048; H01L 51/0525; H01L 51/0541; H01L 51/055; H01L 51/0558; H01L 51/0529
USPC .......................................................... 257/29
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2007/0161213 A1* | 7/2007 | Hiura ................. B82Y 10/00 438/478 |
| 2009/0201743 A1* | 8/2009 | Yang ................ H01L 29/0665 365/185.28 |
| 2011/0133161 A1* | 6/2011 | Bangsaruntip ...... H01L 29/0665 257/24 |
| 2014/0183451 A1* | 7/2014 | Hirai ................... H01L 29/775 257/24 |
| 2014/0299835 A1* | 10/2014 | Rodriguez .......... H01L 29/775 257/9 |

(Continued)

OTHER PUBLICATIONS

Brady, J.G., et al., "Quasi-ballistic carbon nanotube array transistors with current density exceeding Si and GaAs," Science Advances, pp. 1-9 (Sep. 2, 2016).

(Continued)

*Primary Examiner* — Caleen O Sullivan
(74) *Attorney, Agent, or Firm* — Maschoff Brennan

(57) ABSTRACT

A semiconductor device includes a substrate, a nanotube structure, and a gate structure. The nanotube structure is disposed over the substrate. The nanotube structure includes a semiconducting carbon nanotube (s-CNT) and a first insulating nanotube. The first insulating nanotube has an inert surface on the s-CNT. The gate structure includes a first metallic carbon nanotube (m-CNT) over the nanotube structure.

20 Claims, 26 Drawing Sheets

(56) References Cited

U.S. PATENT DOCUMENTS

2018/0090326 A1\* 3/2018 Jagannathan ..... H01L 29/78696
2018/0366666 A1 12/2018 Lu et al.

OTHER PUBLICATIONS

Cao, Q., et al., "Arrays of single-walled carbon nanotubes with full surface coverage for high-performance electronics," Nature Nanotechnology, vol. 8, pp. 180-186 (Mar. 2013).
U.S. Appl. No. 16/120,15, filed Aug. 31, 2018.
Joo, Y., et al., "Dose-Controlled, Floating Evaporative Self-assembly and Alignment of Semiconducting Carbon Nanotubes from Organic Solvents," Langmuir, vol. 30, pp. 3460-3466 (2014).
Nakanishi, R., et al., "Thin single-wall BN-nanotubes formed inside carbon nanotubes," Scientific Reports 3, Article No. 1385, 2013, pp. 6 (Mar. 3, 2013).
Shulaker, M.M. et al., "High-Performance Carbon Nanotube Field-Effect Transistors," IEEE International Electron Devices Meeting, pp. 33.6.1-33.6.4 (Dec. 15-17, 2014).
Srimani, T., et al., "30-nm Contacted Gate Pitch Back-Gate Carbon Nanotube FETs for Sub-3-nm Nodes," IEEE Transactions on Nanotechnology, vol. 18, pp. 132-138 (2019).
Walker, E.K., et al., "Growth of Carbon Nanotubes inside Boron Nitride Nanotubes by Coalescence of Fullerenes: Toward the World's Smallest Coaxial Cable," Small Methods, vol. 1, Issue 9, pp. 9 (Jul. 13, 2017).

\* cited by examiner

110/1710

METHOD OF MANUFACTURING A FIELD
EFFECT TRANSISTOR USING NANOTUBE
STRUCTURES AND A FIELD EFFECT
TRANSISTOR

BACKGROUND

As the semiconductor industry has progressed into nanometer technology process nodes in pursuit of higher device density, higher performance, and lower costs, challenges from both fabrication and design issues have resulted in the development of three-dimensional designs, such as GAA structures. Non-Si based low-dimensional materials are promising candidates to provide superior electrostatics (e.g., for short-channel effect) and higher performance (e.g., less surface scattering). Carbon nanotubes (CNTs) are considered one such promising candidate due to their high carrier mobility and substantially one dimensional structure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
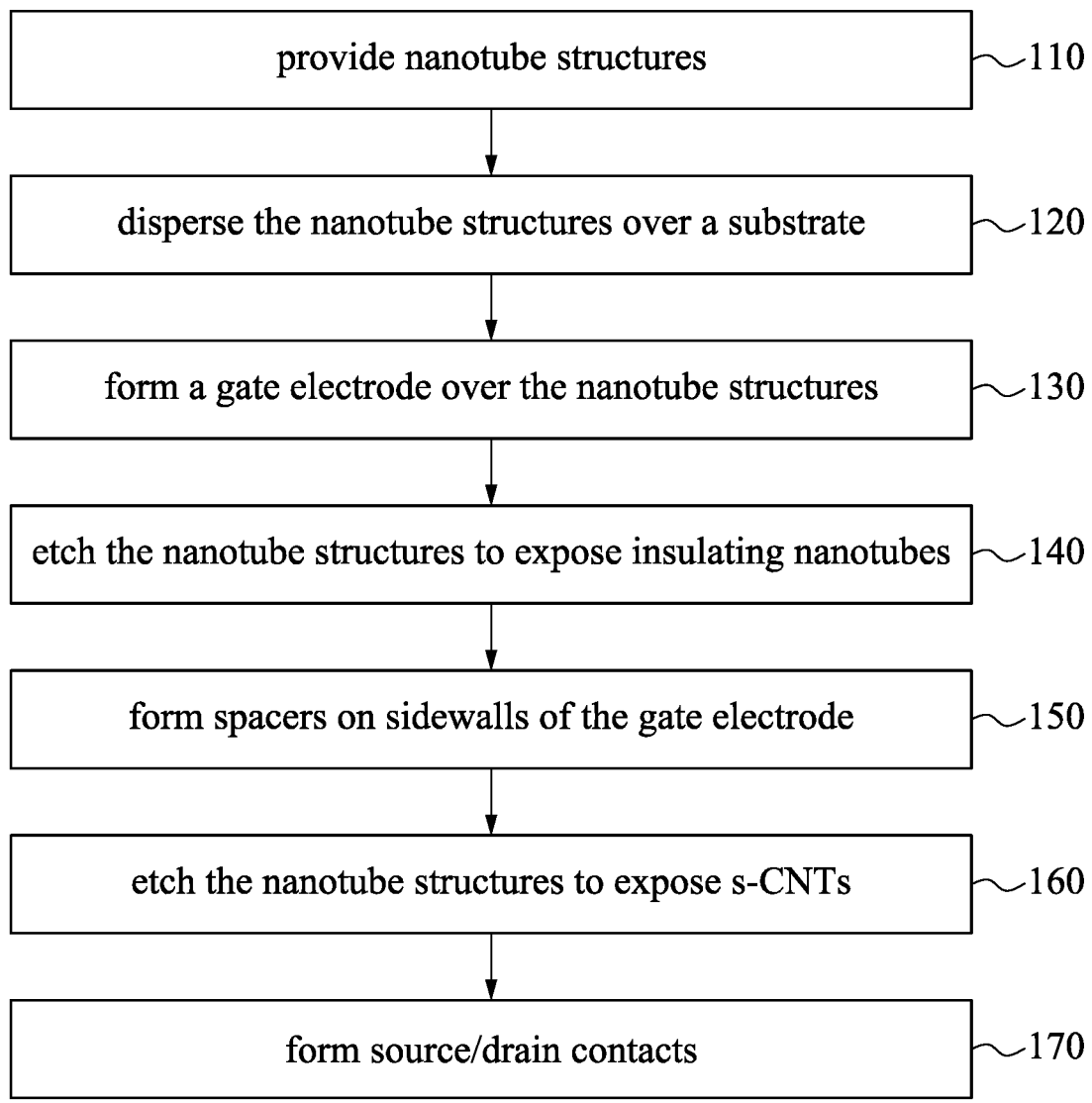
FIG. 1 is a flow chart illustrating a method of forming a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

A semiconductor device includes a field-effect transistor including GAA carbon nanotubes (CNTs). The semiconductor device includes a plurality of CNTs with a gate dielectric wrapping the CNTs and a gate electrode over the gate dielectric. The GAA FETs with CNTs can be applied to logic circuits in advanced technology node. However, fabricating CNT-based devices has led to problems, such as challenges in depositing a high-k dielectric layer in contact with the carbon nanotube which results in a poor gate stack performance. The following embodiments provide a GAA FET using a nanotube structures including an insulating nanotube with an inert surface as a gate dielectric and its manufacturing process that can resolve these problems.

An inert surface is a surface for which chemisorption of a precursor molecule is not possible to be absorbed on without breaking a lattice or creating a defect of the surface. Conversely, an inert surface is a surface for which it is only possible to physisorb a precursor onto the surface without breaking a lattice or creating a defect.

FIG. 1 is a flow chart illustrating a method 100 of forming a semiconductor device in accordance with some embodiments of the present disclosure. As illustrated in FIG. 1, the method 100 includes blocks 110-170. FIGS. 7-8 and 11-16 illustrate a series of cross-sectional views of a semiconductor structure at various stages according to aspects of the method 100 of FIG. 1. It will be appreciated that although these methods each illustrate a number of blocks and/or features, not all of these blocks and/or features are necessarily required, and other un-illustrated blocks, and/or features may also be present. Also, the ordering of the blocks in some embodiments can vary from what is illustrated in these figures.

Figure 2:
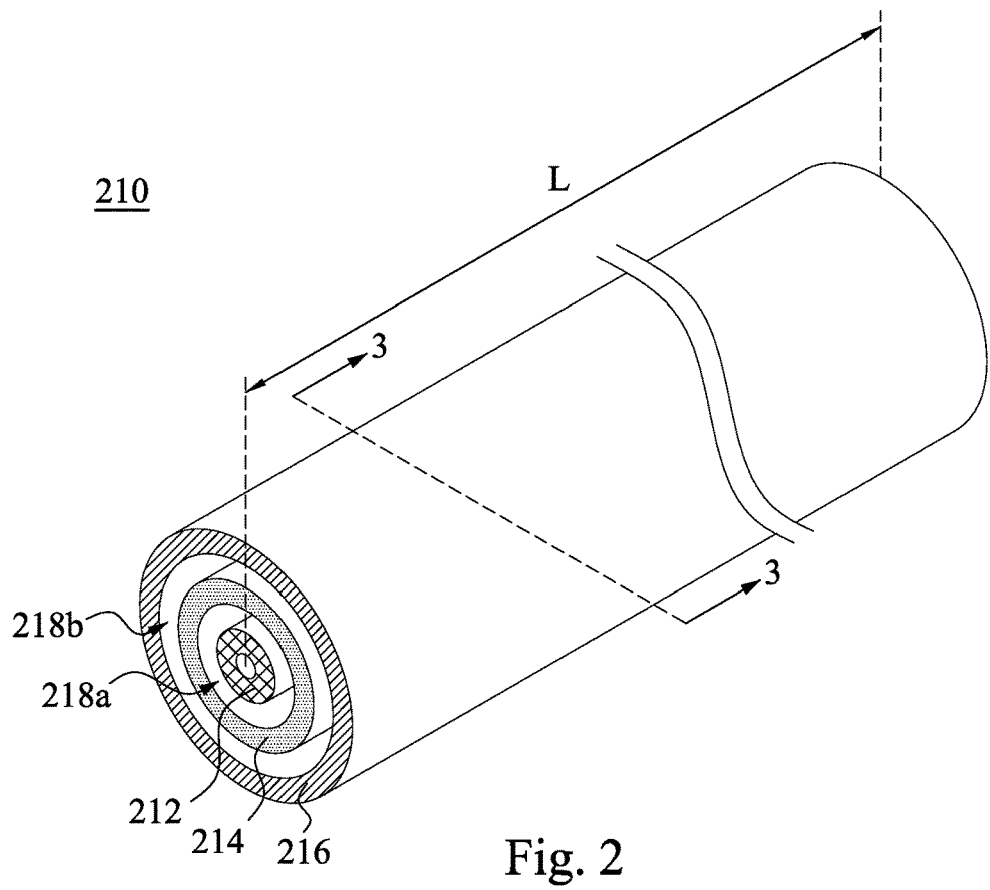
FIG. 2 is a perspective view illustrating a nanotube structure in accordance with some embodiments of the present disclosure.

The method 100 begins at block 110 where a plurality of nanotube structures is provided. FIG. 2 illustrates a perspective view of a nanotube structure 210 in accordance with some embodiments of the present disclosure. Referring to the example of FIG. 2, in some embodiments of block 110, the nanotube structure 210 includes a semiconducting carbon nanotube (s-CNT) 212, an insulating nanotube 214 surrounding the s-CNT 212, a first interface 218a between the s-CNT 212 and the insulating nanotube 214, a metallic carbon nanotube (m-CNT) 216 surrounding the insulating nanotube 214, and a second interface 218b between the m-CNT 216 and the insulating nanotube 214. In this embodiment, the s-CNT 212 is a hollow nanotube. In an alternative embodiment, the s-CNT 212 is a solid nanotube.

In an embodiment, as will be described below in detail, the insulating nanotube 214 may serve as a gate dielectric of a gate structure of a transistor. In such an embodiment, the s-CNT 212 at opposite sides of the gate structure may serve as first and second source/drain regions of the transistor, respectively. The m-CNT 216 on the gate dielectric may serve as a portion of a gate electrode of the gate structure.

The s-CNT 212 includes carbon, and the s-CNT 212 has a surface that is inert, e.g., both or at least one of inner and outer surfaces of the s-CNT 212 are inert. The insulating nanotube 214 has an inert surface, e.g., both or at least one of inner and outer surfaces of the insulating nanotube 214 are inert. Example of materials for the insulating nanotube 214 includes nitride of Group 3A materials, such as boron nitride (BN) and aluminum nitride (AlN). As such, the first interface 218a is substantially free of dangling bonds. For example, the density of the dangling bonds of the first interface 218a ranges from about 2/nm$^2$ to about 10/nm$^2$ in some embodiments, and from about 5/nm$^2$ to about 7/nm$^2$ in other embodiments. In certain embodiments, the density of the dangling bonds of the first interface 218a ranges from about 0/nm$^2$ to about 1/nm$^2$.

The m-CNT 216 has a different structure from a structure of the s-CNT 212 which causes that the m-CNT 216 has an electronic property similar to a metal, and the s-CNT 212 has an electronic property similar to a semiconductor. Similar to the s-CNT 212, the m-CNT 216 has an inert surface, e.g., both or at least one of inner and outer surfaces of the m-CNT 216 are inert. As such, the second interface 218b is substantially free of dangling bonds. For example, the density of the dangling bonds of the second interface 218b ranges from about 2/nm$^2$ to about 10/nm$^2$ in some embodiments, and from about 5/nm$^2$ to about 7/nm$^2$ in other embodiments. In certain embodiments, the density of the dangling bonds of the second interface 218b ranges from about 0/nm$^2$ to about 1/nm$^2$.

In some embodiments, the structure of m-CNT 216 has an armchair configuration, and the structure of s-CNT 212 has a zigzag configuration.

From the above, because the s-CNT 212, the insulating nanotube 214, and the m-CNT 216 have inert surfaces, a Van der Waals gap/separation (i.e., the interfaces 218a and 218b) may be formed between the s-CNT 212 and the insulating nanotube 214, and between the m-CNT 216 and the insulating nanotube 214. In other words, the s-CNT 212, the insulating nanotube 214, and the m-CNT 216 are spaced from each other, i.e., not in contact with each other. The s-CNT 212, the insulating nanotube 214, and the m-CNT 216 are anchored to each other with Van Der Waals attraction. As such, a gate structure with optimum performance may be fabricated using the nanotube structure 210 of the present disclosure.

In some embodiment, as illustrated in FIG. 2, the nanotube structure 210 has a length (L) in a range from about tens of nanometer to about hundreds of micrometer.

Figure 3:
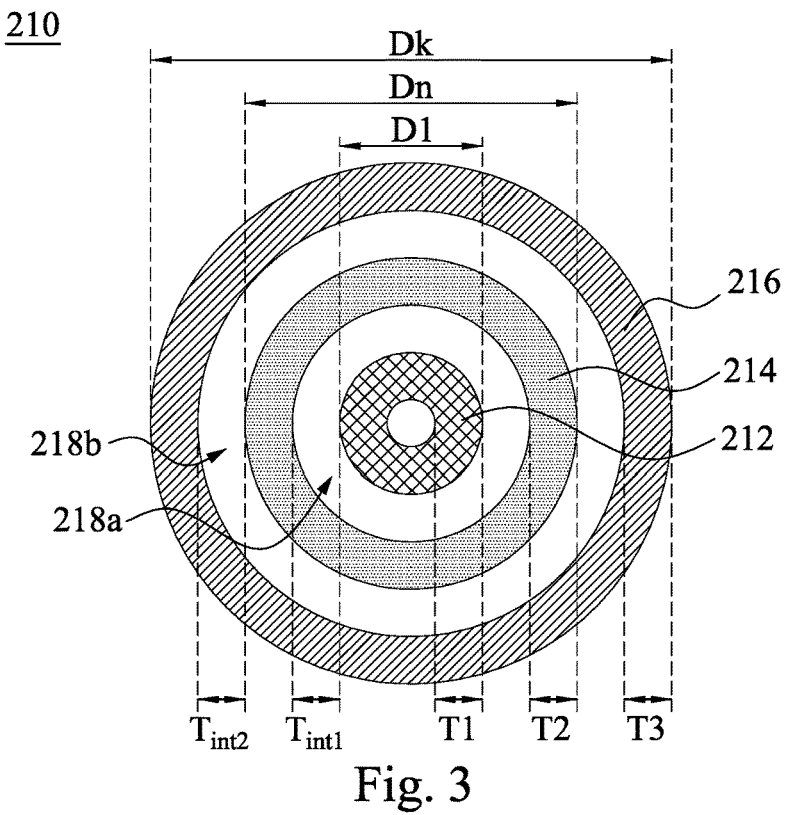
FIGS. 3-6 are cross-sectional views illustrating a nanotube structure in accordance with some embodiments of the present disclosure.

FIG. 3 is a cross-sectional view of the nanotube structure 210 taken along line 3-3 in FIG. 2. Referring to the example of FIG. 3, in some embodiments, an outer diameter (D1) of the s-CNT 212 of the nanotube structure 210 is in a range from about 0.8 nm to about 1.3 nm. The s-CNT 212 may have a band gap associated with the outer diameter of the s-CNT 212. In some embodiments, the bandgap (Eg) of the s-CNT 212 may be calculated as follows:

$$Eg = 2\gamma a_{cc}/D1 \qquad \text{eq. (1)}$$

where γ is the nearest-neighbor overlap energy, $a_{cc}$ is the length of carbon-carbon bond, and D1 is the outer diameter of the s-CNT 212.

In some embodiments, a thickness (T1) of the s-CNT 212 of the nanotube structure 210 is in a range from about 0.30 nm to about 0.38 nm. For example, the thickness (T1) of the s-CNT 212 of the nanotube structure 210 is about 0.34 nm.

In some embodiments, the thickness (T2) of the insulating nanotube 214 is in a range from about 0.30 nm to about 0.36 nm. For example, the thickness (T2) of the insulating nanotube 214 of the nanotube structure 210 is about 0.33 nm.

In some embodiments, a thickness ($T_{int1}$) of the first interface 218a, i.e., the Van Der Waals gap/separation between the s-CNT 212 and the insulating nanotube 214 may be substantially the same as the thickness (T1) of the s-CNT 212. In some embodiments, the thickness ($T_{int1}$) of the first interface 218a is in a range from about 0.30 nm to about 0.38 nm. For example, the thickness ($T_{int1}$) of the first interface 218a is about 0.34 nm.

An outer diameter (Dn) of the insulating nanotube 214 of the nanotube structure 210 may be calculated as follows:

$$Dn(n) = D1 + 2nT_{int1} + 2nT2 \qquad \text{eq. (2)}$$

where n is the nth layer of the insulating nanotube 214, D1 is the outer diameter of the s-CNT 212, $T_{int1}$ is the thickness of the first interface 218a, and T2 is the thickness of the insulating nanotube 214. As such, with reference to the example FIG. 3, the outer diameter (Dn) of the insulating nanotube 214 of the nanotube structure 210 is Dn(1)=D1+ $2T_{int1}$+2T2. On the other hand, with reference to the example of FIGS. 5 and 6, the outer diameters (Dn) of the second insulating nanotubes 214b of the nanotube structures 510, 610 are Dn(2)=D1+4$T_{int1}$+4T2.

In some embodiments, a thickness (T3) of the m-CNT 216 of the nanotube structure 210 is substantially the same as the thickness (T1) of the s-CNT 212. In some embodiments, the thickness (T3) of the m-CNT 216 of the nanotube structure 210 is in a range from about 0.30 nm to about 0.38 nm. For example, the thickness (T3) of the m-CNT 216 is about 0.34 nm.

In some embodiments, a thickness ($T_{int2}$) of the second interface 218b, i.e., the Van Der Waals gap/separation between the m-CNT 216 and the insulating nanotube 214, may be substantially the same as the thickness ($T_{int1}$) of the first interface 218a. In some embodiments, the thickness ($T_{int2}$) of the second interface 218b is in a range from about 0.30 nm to about 0.38 nm. For example, the thickness ($T_{int2}$) of the second interface 218b is about 0.34 nm.

An outer diameter (Dk) of the m-CNT 216 of the nanotube structure 210 may be calculated as follows:

$$Dk(k)=Dn(n)+2kT_{int2}+2kT3 \qquad \text{eq. (3)}$$

where n is the nth layer of the insulating nanotube 214, k is the kth layer of the m-CNT 216, Dn(n) is the outer diameter of the nth layer of the insulating nanotube, $T_{int2}$ is the thickness of the second interface 218b, and T3 is the thickness of the m-CNT 216. As such, with reference to the example of FIG. 3, the outer diameter (Dk) of the m-CNT 216 of the nanotube structure 210 is Dk(1)=Dn(1)+2$T_{int2}$+2T3. In some embodiments, with reference to the example of FIG. 4, the outer diameter (Dk) of the second m-CNT 216b of the nanotube structure 410 is Dk(2)=Dn(1)+4$T_{int2}$+4T3. In certain embodiments, with reference to the example of FIGS. 5 and 6, the outer diameters (Dk) of the m-CNTs 216, 216a of the nanotube structures 510, 610 are Dk(1)=Dn(2)+2$T_{int2}$+2T3. In other embodiments, with reference to the example of FIG. 6, the outer diameter (Dk) of the second m-CNT 216b of the nanotube structure 610 is Dk(2)=Dn(2)+4$T_{int2}$+4T3.

Figure 4:
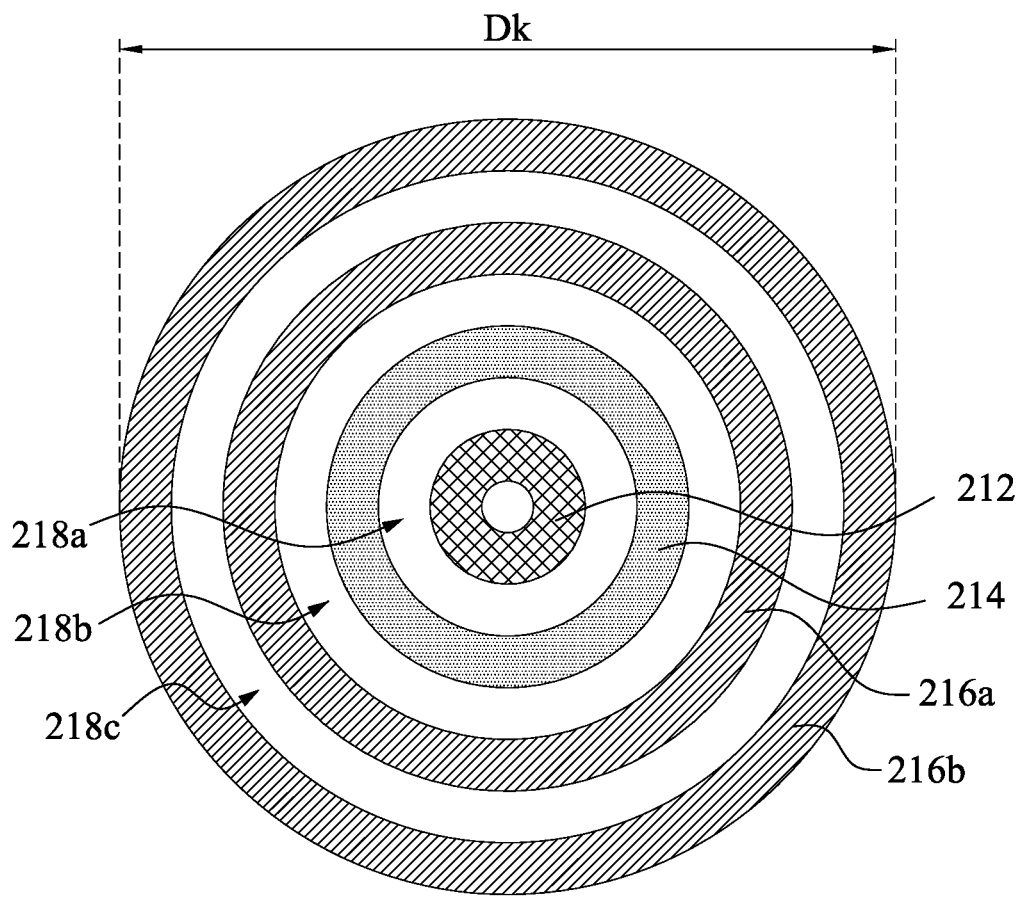
Figure 5:
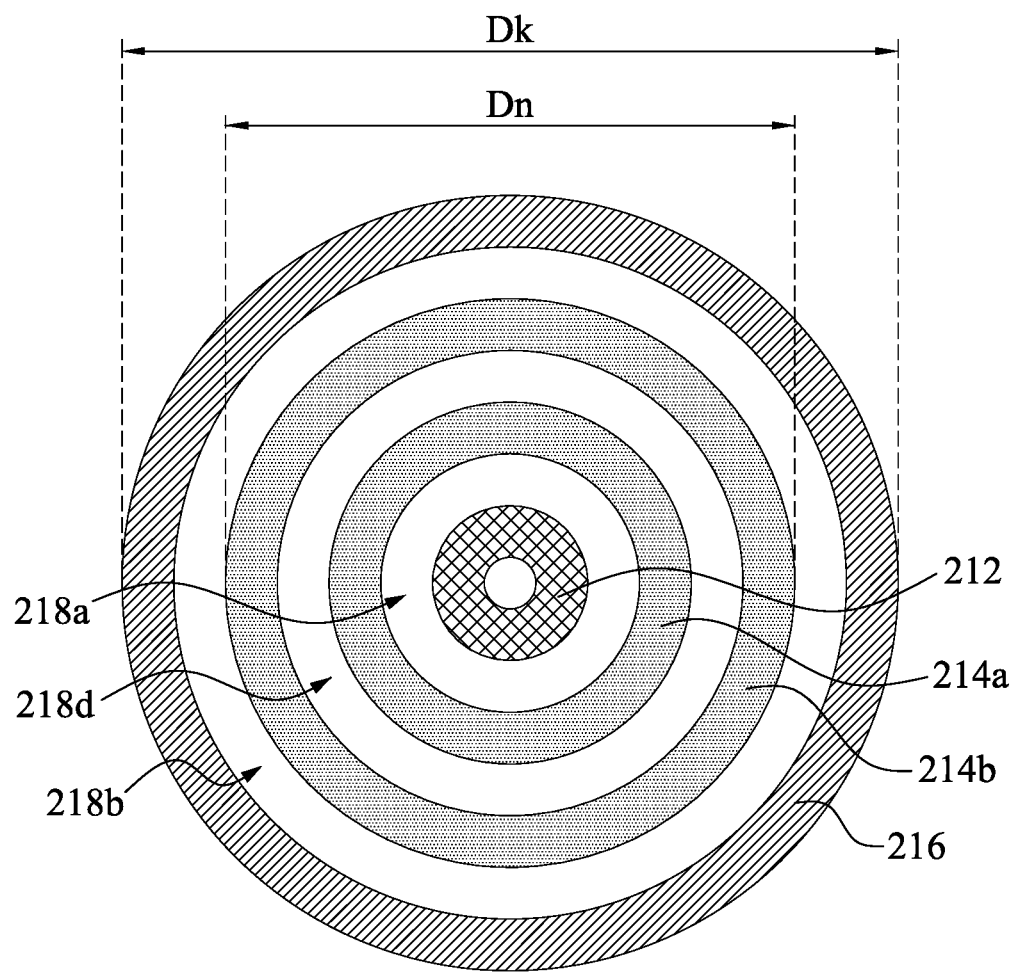
Figure 6:
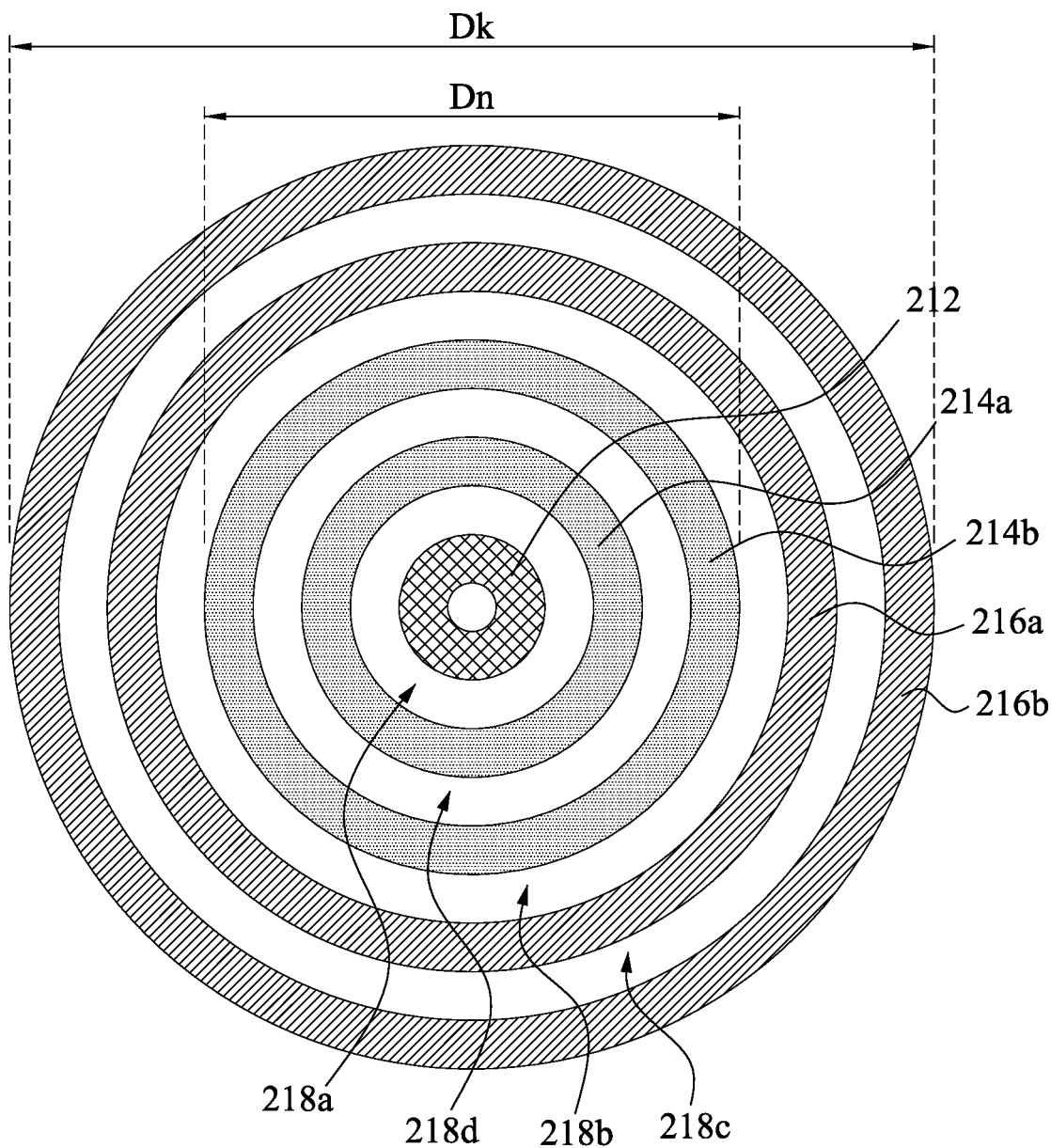

It is noted that, while the nanotube structure 210, in this embodiment, includes only a single layer of the insulating nanotube 214 and a single layer of the m-CNT 216, the number of layers of the insulating nanotube 214 and the m-CNT 216 may be increased as required. For example, referring to FIGS. 4-6, where FIGS. 4-6 are cross-sectional views illustrating nanotube structures 410, 510, 610, respectively in accordance with some embodiments of the present disclosure. As illustrated in FIGS. 4 and 6, the number of layers of the m-CNTs 216a, 216b may be increased, e.g., to two or more layers, so that a damage at a surface of an inner m-CNT 216a can be repaired by an outer m-CNT 216b. Accordingly, a third Van Der Waals gap/separation or interface 218c is formed between the inner and outer m-CNTs 216a, 216b.

As illustrated in FIGS. 5 and 6, the number of layers of the insulating nanotubes 214a, 214b may be increased, e.g., to two or more layers, so that a leakage current of a gate structure formed using the nanotube structures 510, 610 can be reduced. Accordingly, a fourth Van Der Waals gap/separation or interface 218d is formed between the insulating nanotubes 214a, 214b.

The thicknesses of the s-CNTs 212 of the nanotube structures 410, 510, 610 are substantially the same as the thickness (T1) of the s-CNT 212 of the nanotube structure 210. The thicknesses of the insulating nanotubes 214, 214a, 214b of the nanotube structures 410, 510, 610 are substantially the same as the thickness (T2) of the insulating nanotube 214 of the nanotube structure 210. The thicknesses of the m-CNTs 216, 216a, 216b of the nanotube structures 410, 510, 610 are substantially the same as the thickness (T3) of the m-CNT 216 of the nanotube structure 210. The thicknesses of the first interfaces 218a of the nanotube structures 410, 510, 610 are substantially the same as the thickness ($T_{int1}$) of the first interface 218a of the nanotube structure 210. The thicknesses of the second interfaces 218b of the nanotube structures 410, 510, 610 are substantially the same as the thickness ($T_{int2}$) of the second interface 218b of the nanotube structure 210. The thicknesses of the third interfaces 218c of the nanotube structures 410, 610 are substantially the same as the thickness ($T_{int1}$) of the first interface 218a and the thickness ($T_{int2}$) of the second interface 218b of the nanotube structure 210. The thicknesses of the fourth interfaces 218d of the nanotube structures 510, 610 are substantially the same as the thickness ($T_{int1}$) of the first interface 218a and the thickness ($T_{int2}$) of the second interface 218b of the nanotube structure 210.

The outer diameters of the s-CNTs 212 of the nanotube structures 410, 510, 610 are substantially the same as the outer diameter (D1) of the s-CNT 212 of the nanotube structure 210. The outer diameters of the insulating nanotubes 214, 214a of the nanotube structures 410, 510, 610 are substantially the same as the outer diameter (Dn) of the insulating nanotube 214 of the nanotube structure 210. The outer diameter of the m-CNT 216a of the nanotube structure 410 is substantially the same as the outer diameter (Dk) of the m-CNT 216 of the nanotube structure 210.

Figure 7:
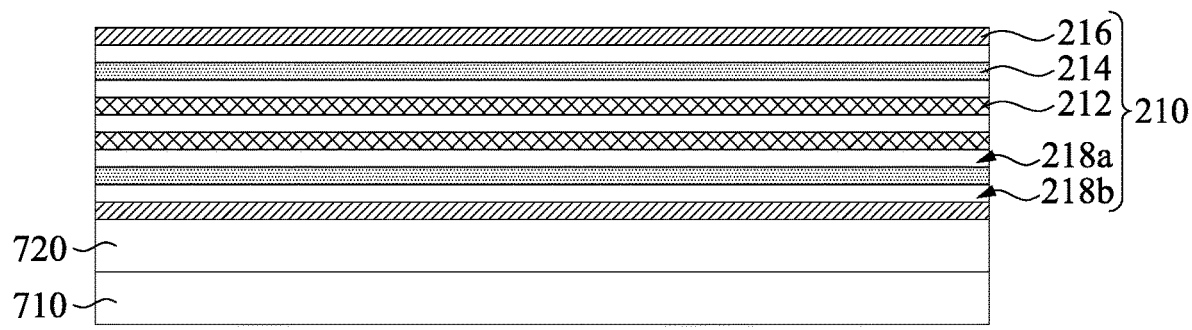
FIGS. 7 and 8 are cross-sectional views illustrating a semiconductor device at various stages of manufacturing in accordance with some embodiments of the present disclosure.
Figure 8:
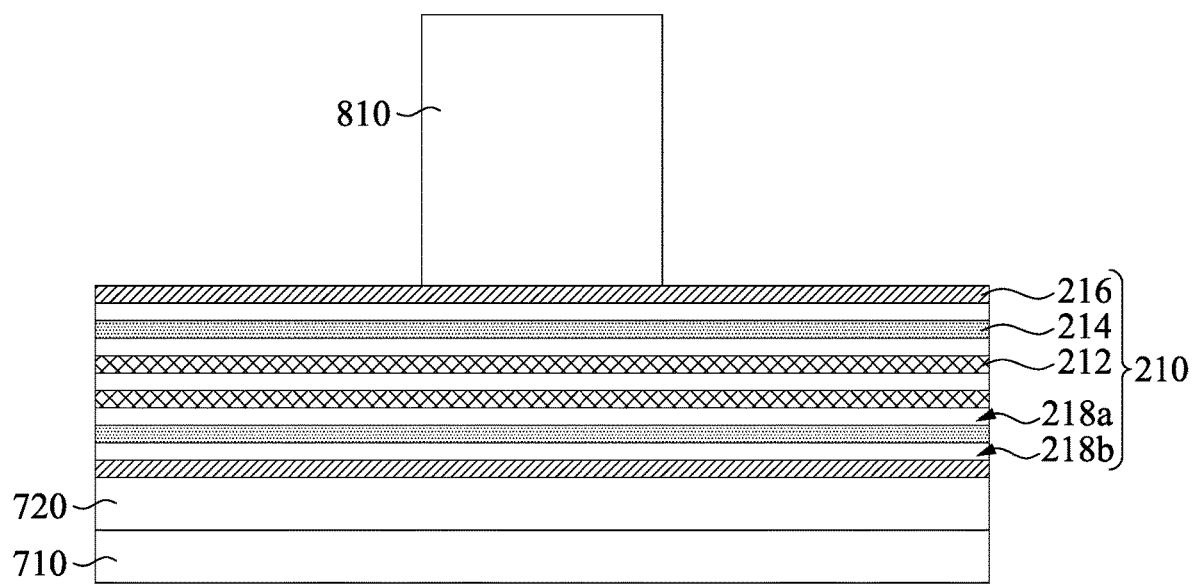
Figure 9:
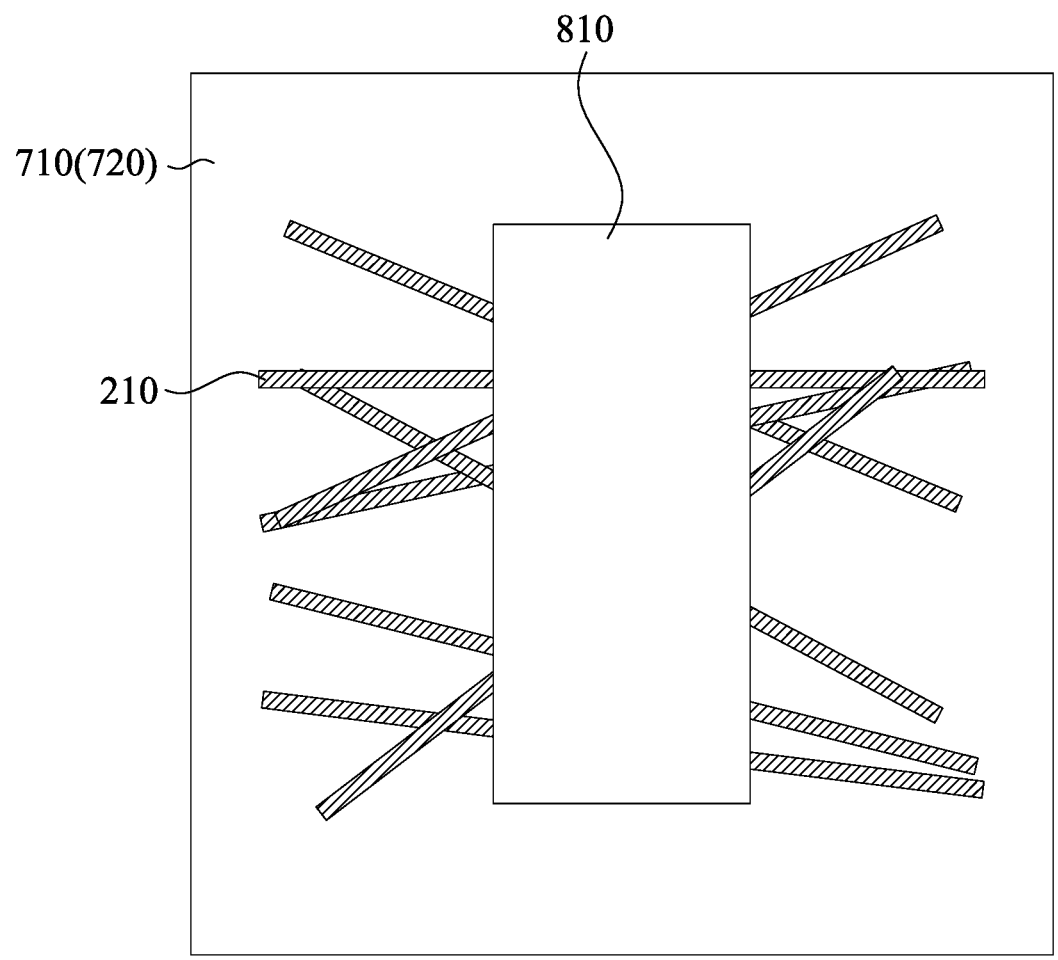
FIGS. 9 and 10 are top views illustrating a semiconductor device at various stages of manufacturing in accordance with some embodiments of the present disclosure.
Figure 10:
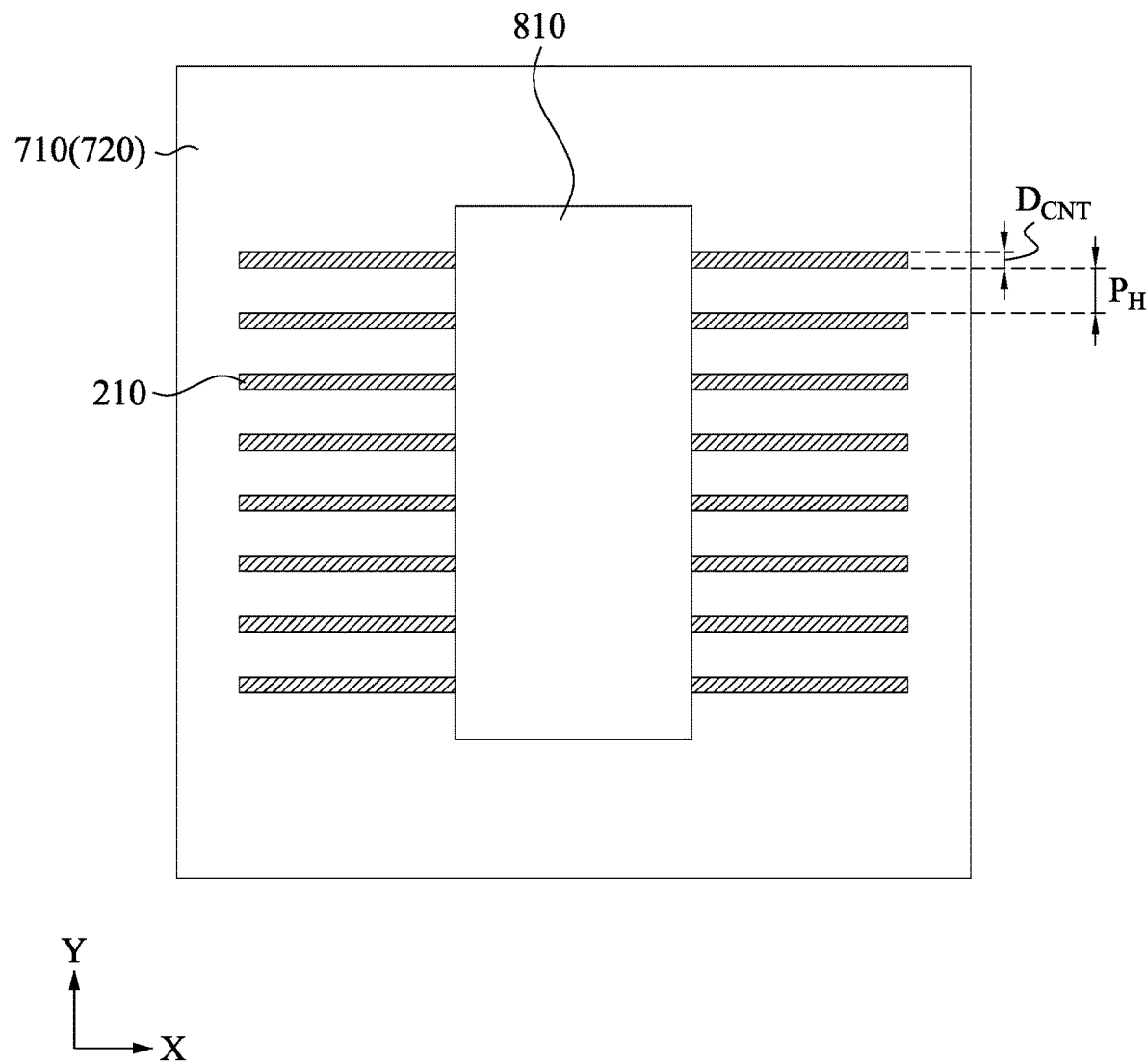
Figure 11:
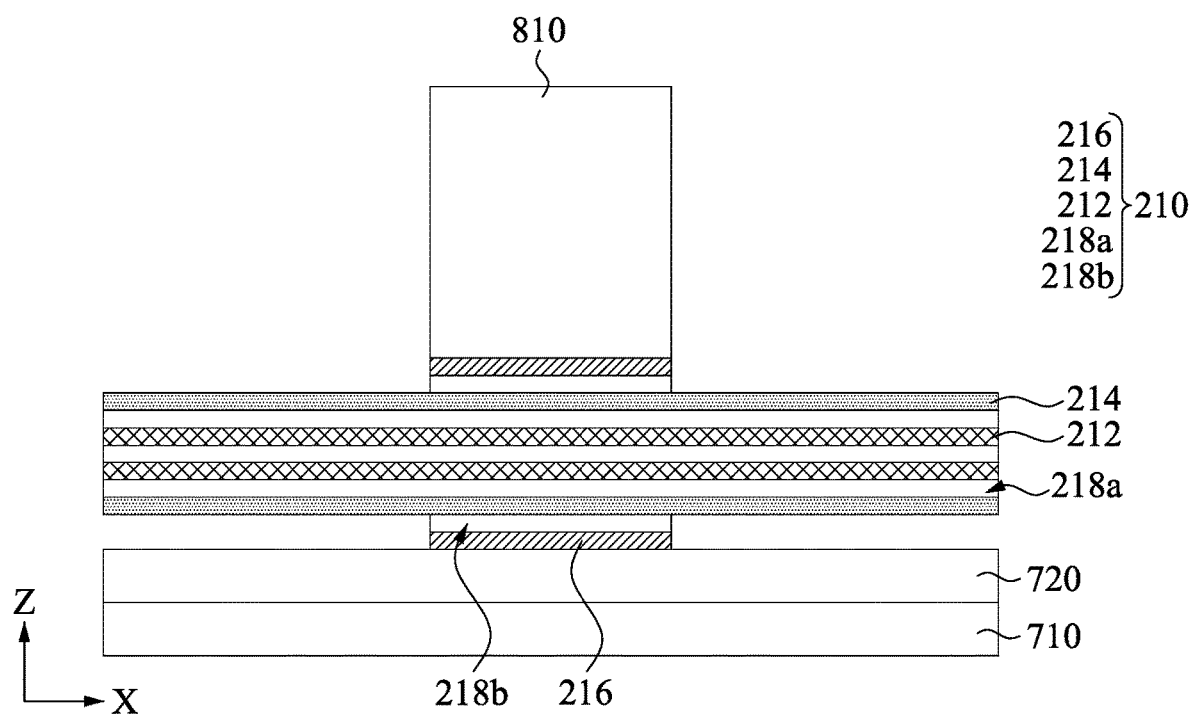
FIGS. 11-16 are cross-sectional views illustrating a semiconductor device at various stages of manufacturing in accordance with some embodiments of the present disclosure.
Figure 12:
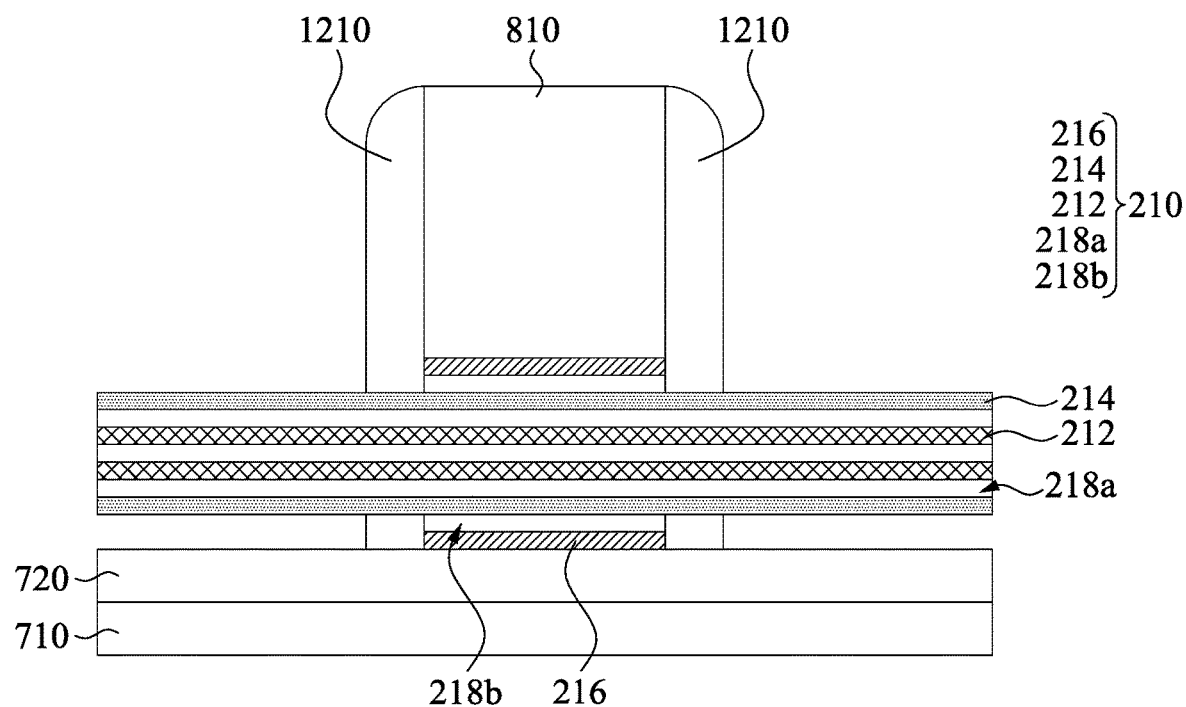
Figure 13:
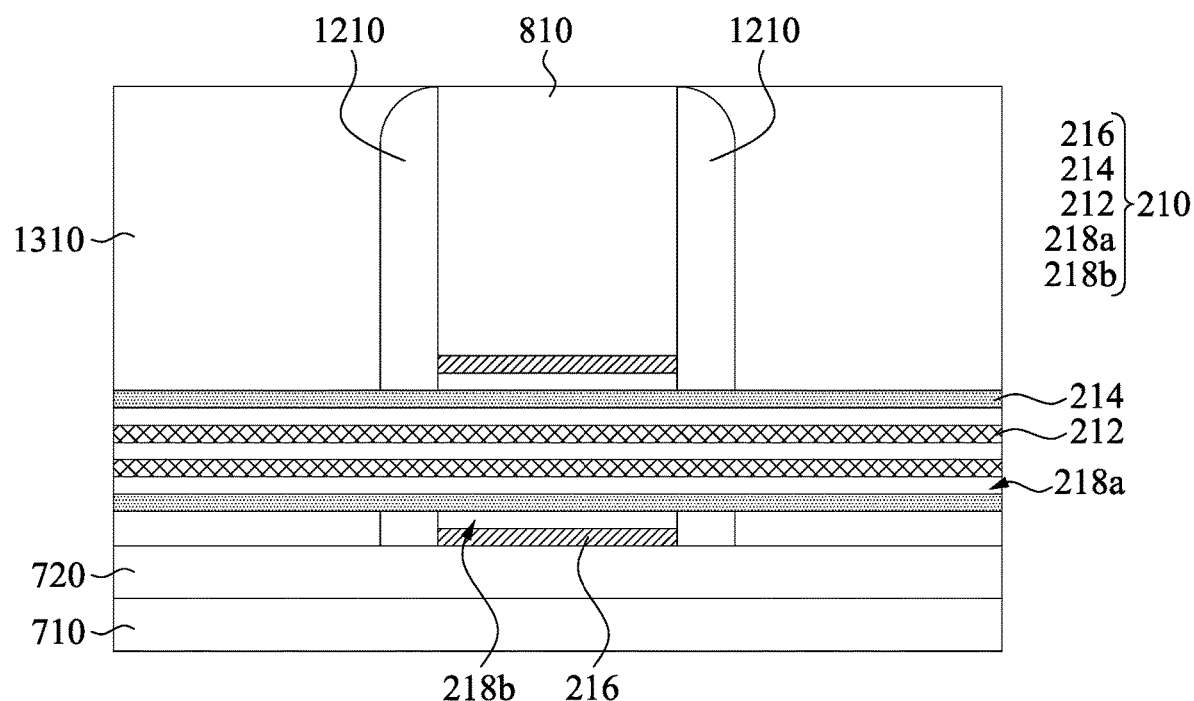

Subsequent to block 110, the following blocks 120-170 of method 100 illustrate fabrication of a transistor using the nanotube structures 210. After block 110, the method 100 proceeds to block 120 where the nanotube structures 210 are dispersed over a substrate. The nanotube structures 210 may be dispersed over the substrate 710 in an irregular/random arrangement, as illustrated in FIG. 9, or an orderly arrangement, as illustrated in FIG. 10. FIGS. 9 and 10 are top views illustrating a gate electrode 810 over the nanotube structures 210. Referring to the example of FIG. 7, in some embodiments of block 120, the substrate 710 that is formed with a support layer 720 thereon is provided. FIG. 7 illustrates cross-sections of the substrate 710, the support layer 720, and the nanotube structure 210 taken along the length (L) of the nanotube structure 210. In some embodiments, the substrate 710 is made of a suitable elemental semiconductor, such as silicon, diamond or germanium; a suitable alloy or compound semiconductor, such as Group-IV compound semiconductors (e.g., silicon germanium (SiGe), silicon carbide (SiC), silicon germanium carbide (SiGeC), GeSn, SiSn, SiGeSn), Group III-V compound semiconductors (e.g., gallium arsenide, indium gallium arsenide (InGaAs)), indium arsenide, indium phosphide, indium antimonide, gallium arsenic phosphide, or gallium indium phosphide), or the like. An insulating material, such as a glass, may be used as the substrate 710.

The support layer 720 is made from a material that insulates the nanotube structure 210 from the substrate 710. In some embodiments, the support layer 720 includes one or more layers of silicon oxide, silicon nitride, SiON, SiOC, SiOCN and SiCN, or other suitable insulating material. In other embodiments, the support layer 720 includes a polycrystalline or amorphous material of one of Si, Ge and SiGe. The support layer 720 can be formed by suitable film formation methods, such as thermal oxidation, chemical vapor deposition (CVD), physical vapor deposition (PVD) or atomic layer deposition (ALD). In certain embodiments, silicon oxide (e.g., $SiO_2$) is used as the support layer 720.

The thickness of the support layer 720 is in a range from about 2 nm to about 10 nm in some embodiments, and is in a range from about 3 nm to 5 nm in other embodiments. In certain embodiments, the thickness of the support layer 720 can be larger, e.g., a few hundred nm, so long the support layer 720 can insulate the nanotube structure 210 from the substrate 710.

Prior to or after providing the substrate 710 with the support layer 720, the nanotube structures 210 may be placed in a solvent. Examples of solvent include, but are not limited to, sodium dodecyl sulfate (SDS) and 1,2-dichloroethane (DCE). Subsequently, the nanotube structures 210 are transferred onto the substrate 710 using various methods. Examples of such methods include, but are not limited to, floating evaporative self-assembly described in "Dose-controlled, floating evaporative self-assembly and alignment of semiconducting carbon nanotubes from organic solvent" (Y. Joo et al., Langmuir 30, 2460-3466 (2014) or "Quasi-ballistic carbon nanotube array transistors with current density exceeding Si and GaAs" (G. J. Brady et al., Sci. Adv. 2106, 2-e1601240, September, 2016), the entire contents of both of which are incorporated herein by reference. Other methods described by "30-nm Contacted gate pitch back-gate carbon nanotube FETs for sub-3-nm nodes" (T. Srimani et al., IEEE Transactions on Nanotechnology, vol. 18, pp. 132-138, 2019), "Arrays of single-walled carbon nanotubes with full surface coverage for high-performance electronics" (Q. Cao et al., Nature Nanotechnology, vol. 7, December 2012), or "High-Performance carbon nanotube Field-Effect Transistors" (M. Shulaker et al., IEDM 2014) can also be employed. Thereafter, the solvent is removed from the substrate 710 by evaporation or blowing air, leaving the nanotube structures 210 over the substrate 710. In an alternative embodiment, the substrate 710 does not include the support layer 720 and the nanotube structures 210 are directly disposed over a top surface of the substrate 710.

After block 120, the method 100 proceeds to block 130 where a gate electrode is formed over the nanotube structure 210. Referring to the example of FIG. 8, in some embodiments of block 130, the gate electrode 810 is formed over the nanotube structure 210 such that the gate electrode 810 is in contact with the m-CNT 216 of the nanotube structure 210. The gate electrode 810 may be formed by ALD, PVD, CVD, e-beam evaporation, or other suitable process. Thereafter, a lithography and reactive ion etch (RIE) techniques are used to pattern the gate electrode 810. In some embodiments, the gate electrode 810 includes one or more conductive materials selected from a group consisting of W, Cu, Ti, Ag, Al, TiAl, TiAlN, TaC, TaCN, TaSiN, Mn, Co, Pd, Ni, Re, Ir, Ru, Pt, and Zr. The gate electrode 810 has a thickness in a range from about 5 nm to about 15 nm in some embodiments, and has a thickness in a range from about 10 nm to about 12 nm in other embodiments.

As mentioned above, referring to the example of FIG. 9, in some embodiments, the nanotube structures 210 may be arranged in an irregular/random manner over the support layer 720. Specifically, the nanotube structures 210 are oriented in different directions, stacked one above the other, and thus cross each other. In such some embodiments, the gate electrode 810 is formed over intersections of the nanotube structures 210 and surrounds the nanotube structures 210. Both end portions of the nanotube structures 210 at opposite sides of the gate electrode 810 are exposed by the gate electrode 810.

As also mentioned above, the nanotube structures 210 are arranged in an orderly manner. For example, referring to the example of FIG. 10, the nanotube structures 210 are oriented substantially parallel to each other. In other words, the nanotube structures 210 are oriented in the same first direction (e.g., X direction) and aligned with each other in a second direction (e.g., Y direction) transverse to the first direction. In such other embodiments, the gate electrode 810 is formed substantially over the nanotube structures 210 such that both ends of the nanotube structures 210 at the opposite sides of the gate electrode 810 are exposed by the gate electrode 810. The deviation from the X direction of the alignment of the nanotube structures 210 is about ±10 degrees in some embodiments, and is about ±5 degrees in other embodiments. In certain embodiments, the deviation is about ±2 degrees.

Also in the embodiment of FIG. 10, the nanotube structures 210 may have a uniform ($P_H$). In certain embodiments, the pitch ($P_H$) of the nanotube structure 210 is associated with an average diameter ($D_{CNT}$) of the nanotube structure 210. For example, when the average diameter of the nanotube structures 210 is $D_{CNT}$, a pitch $P_H$ of the nanotube structures 210 is $D_{CNT} \leq P_H \leq 10 \times D_{CNT}$. In an alternative embodiment, at least one of adjacent pair of the nanotube structures 210 is in contact with each other.

The density of the nanotube structures 210 over the substrate 710 is in a range from about 50 tubes/μm to about 300 tubes/μm in some embodiments and in other embodiments, the density of the nanotube structures 210 is in a range from about 100 tubes/μm to about 200 tubes/μm.

The method 100 proceeds to block 140 where the m-CNT 216 of the nanotube structure 210 not covered by the gate electrode 810 is etched, exposing the insulating nanotube 214. Referring to the example of FIG. 11, in some embodiments of block 140, after the gate electrode 810 is formed over the nanotube structures 210, portions of the nanotube structures 210 are exposed by the gate electrode 810. The exposed portions of the m-CNT 216 are selectively removed by an etching process, such as lithography, RIE, or other suitable process, with the gate electrode 810 being used as an etch mask. As a result, the portions of the insulating nanotube 214 at opposite sides of the gate electrode 810 are exposed.

The method 100 proceeds to block 150 where spacers are formed on sidewalls of the gate electrode 810. Referring to the example of FIG. 12, in some embodiments of block 150, spacers 1210 are formed on sidewalls of the gate electrode 810 and surround the insulating nanotube 214 of the nanotube structure 210. In some embodiments, the spacers 1210 include a low-k dielectric material, such as SiN, SiON, SiOCN, SiCN, and combinations thereof. For example, the low-k dielectric material is blanket deposited over the substrate 710. The low-k dielectric material is then patterned to remove excess portion on the top surface of the gate electrode 810 and the top surface of the substrate 710, thereby, the spacers 1210 are formed on opposite side surfaces of the gate electrode 810, respectively.

The method 100 proceeds to block 160 where the insulating nanotube 214 of the nanotube structure 210 is etched to expose the s-CNT 212 of the nanotube structure 210. Referring to the example of FIG. 13, in some embodiments of block 160, an interlayer dielectric (ILD) layer 1310 is formed over the support layer 720. In some embodiments, the materials of the ILD layer 1310 include compounds comprising Si, O, C and/or H, such as silicon oxide, SiCOH and SiOC. In other embodiments, organic materials, such as polymers, may be used for the ILD layer 1310. After the ILD layer 1310 is formed, a planarization operation, such as chemical mechanical polishing (CMP), is performed, so that the top surface of the gate electrode 810 is exposed by the ILD layer 1310.

Figure 14:
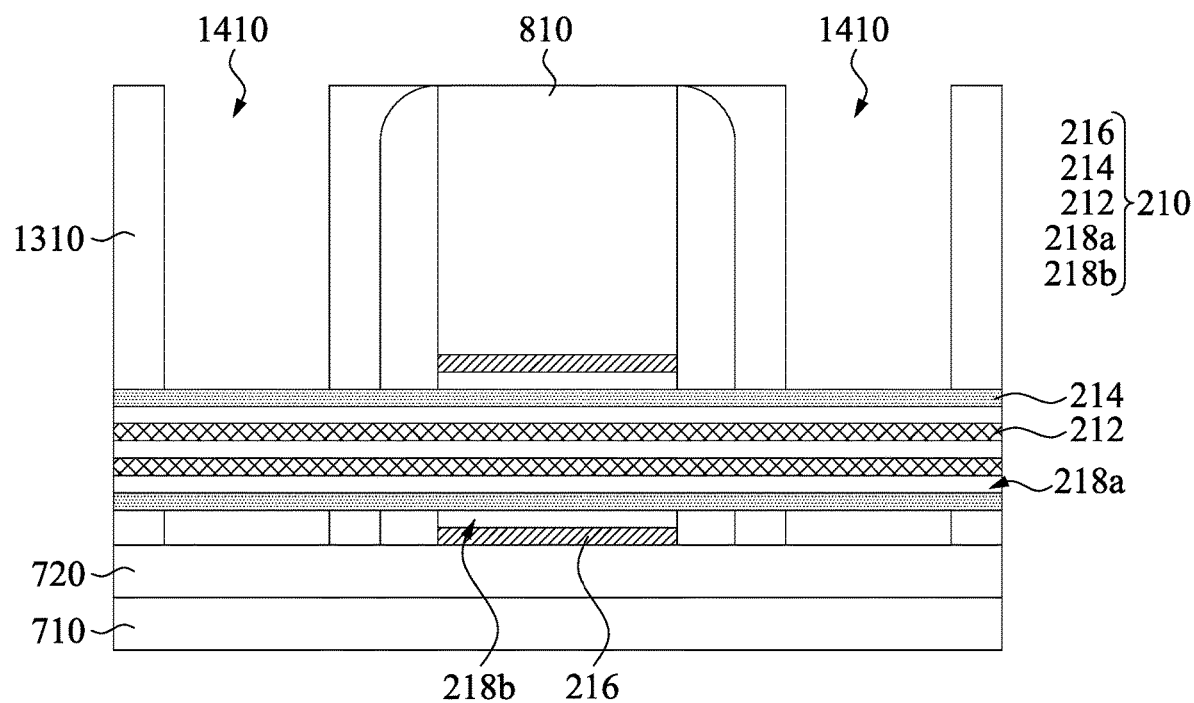

Referring to the example of FIG. 14, in some embodiments of block 160, the ILD layer 1310 is etched by using lithography, RIE, or other suitable process to expose the insulating nanotube 214 of the nanotube structure 210 at opposite sides of the gate electrode 810 to form first and second openings 1410 in the ILD layer 1310 at sides of the spacers 1210 not covered by the gate electrode 810, respectively.

Figure 15:
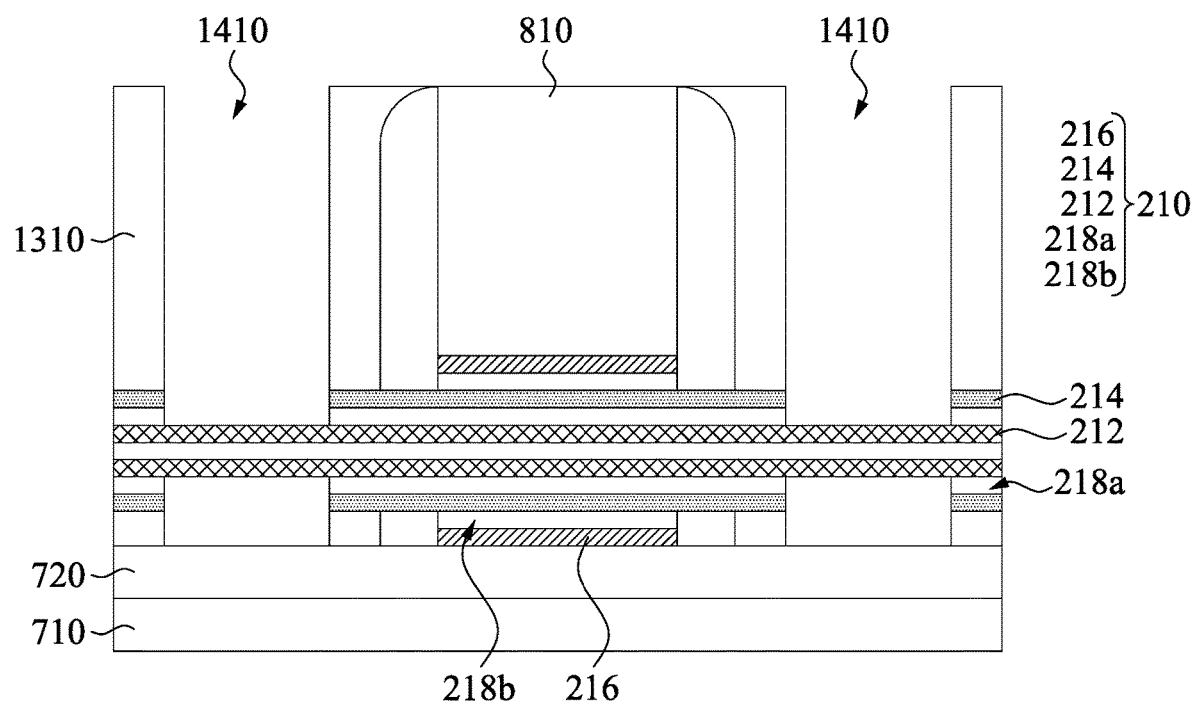

Thereafter, referring to the example of FIG. 15, the insulating nanotube 214 exposed by the first and second openings 1410 are removed by an etching process, such as lithography, RIE, or other suitable process, exposing the s-CNT 212 of the nanotube structure 210.

The method 100 proceeds to block 170 where source/drain contacts are formed in the first and second openings 1410, respectively and on the s-CNT 212 of the nanotube structure 210. Referring to the example of FIG. 16, in some embodiments of block 170, after the insulating nanotube 214 is etched, first and second source/drain contacts 1610 are formed in the first and second openings 1410, respectively. The first and second source/drain contacts 1610 may be formed by filling the first and second openings 1410 with one or more layers of a conductive material. The conductive material includes one or more of W, Cu, Ti, Ag, Al, TiAl, TiAlN, TaC, TaCN, TaSiN, Mn, Co, Pd, Ni, Re, Ir, Ru, Pt, and Zr, or any other suitable conductive materials.

Figure 16:
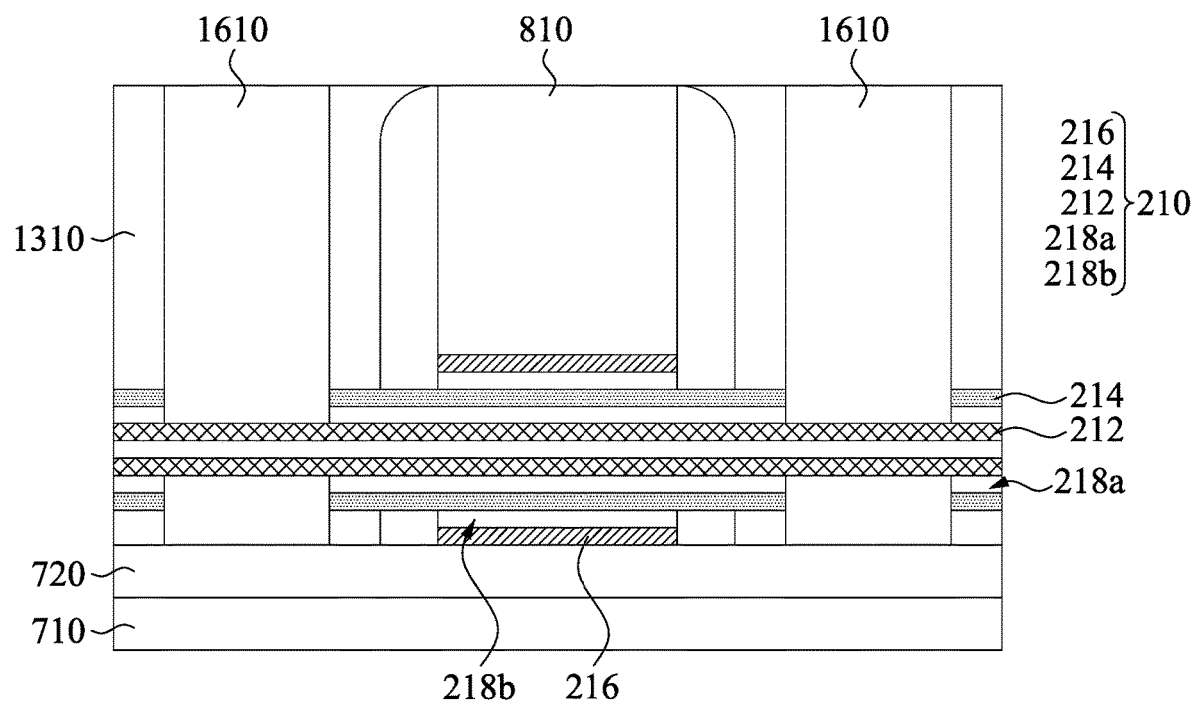

The semiconductor device may undergo further processing to form various features and regions known in the art. For example, subsequent processing may form various contacts/vias/lines and multilayers interconnect features (e.g., metal layers and interlayer dielectrics) on the semiconductor device as illustrated in FIG. 16, configured to connect the various features to form a functional circuit that may include one or more devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure.

Figure 17:
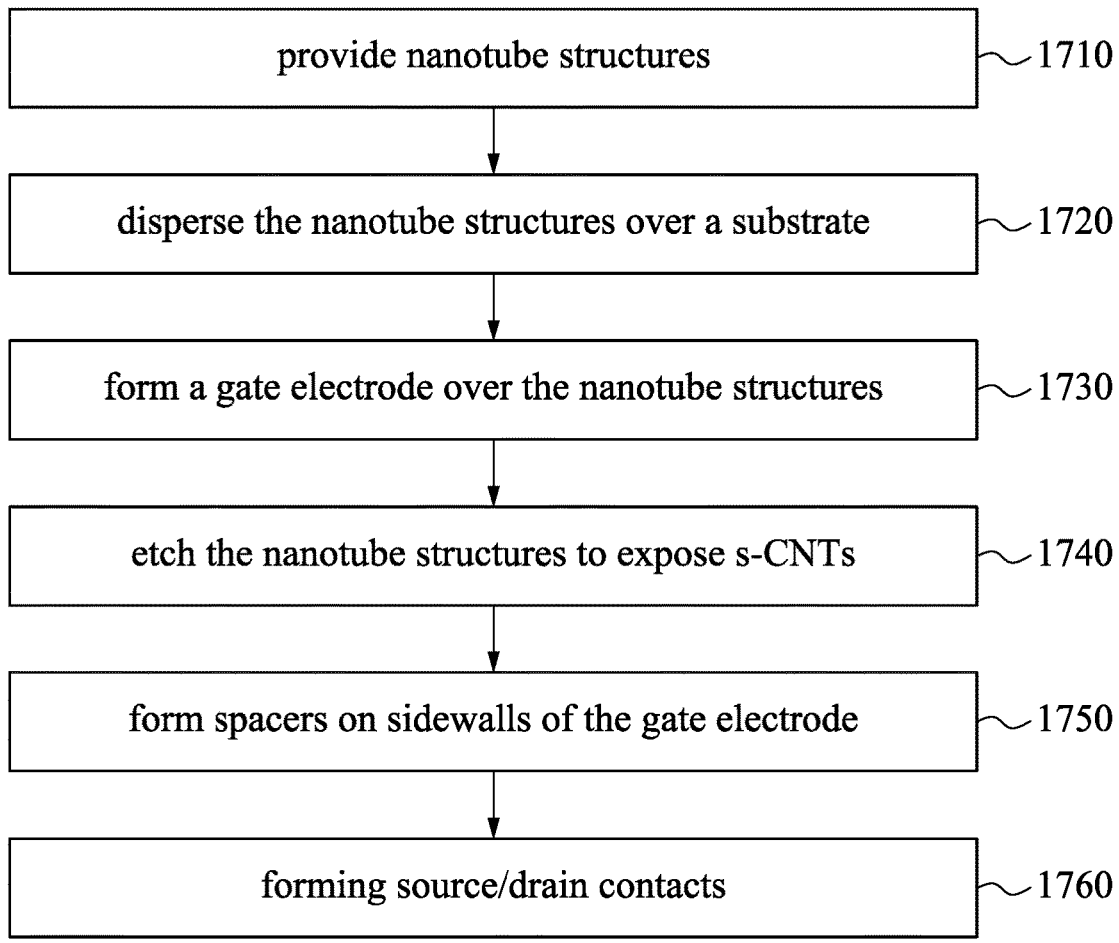
FIG. 17 is a flow chart illustrating a method of forming a semiconductor device in accordance with some embodiments of the present disclosure.
Figure 18:
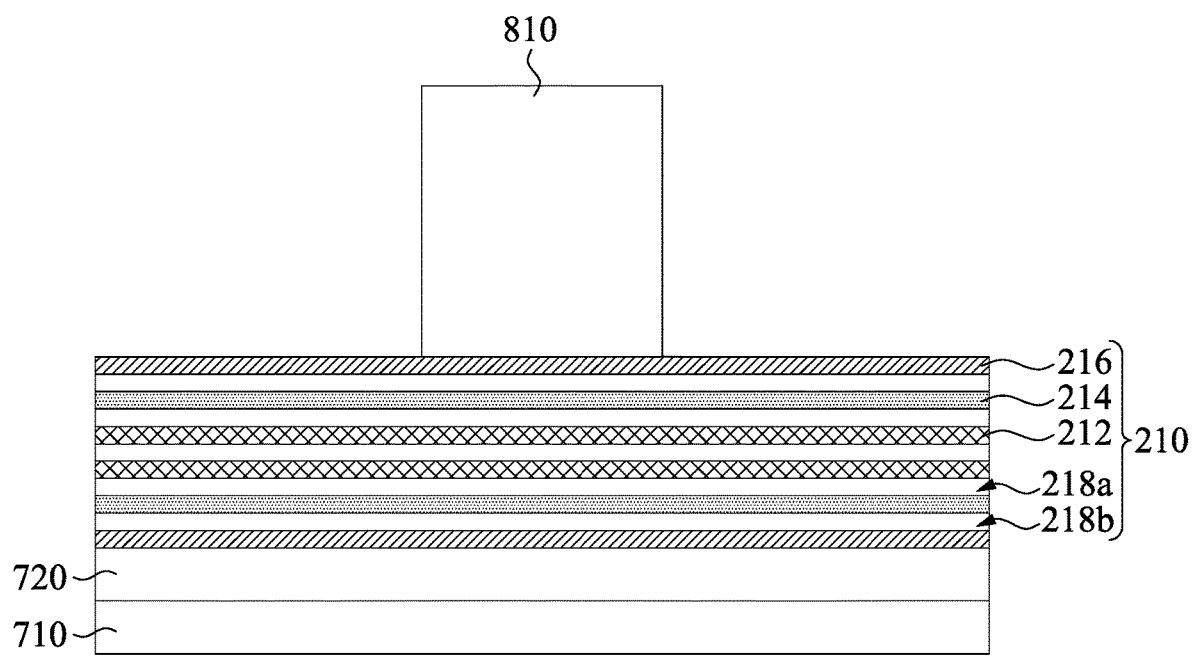
FIGS. 18-23 are cross-sectional views illustrating a semiconductor device at various stages of manufacturing in accordance with some embodiments of the present disclosure.

FIG. 17 is a flow chart illustrating a method 1700 of forming a semiconductor device in accordance with some embodiments of the present disclosure. Method 1700 differs from method 100 in that the insulating nanotube 214 is etched before the spacers 1210 are formed. As such, the spacers 1210 surround and in contact with the s-CNT 212.

As illustrated in FIG. 17, the method 1700 includes blocks 1710-1760. FIGS. 18-23 illustrate a series of cross-sectional views of a semiconductor structure at various stages according to aspects of the method 1700 of FIG. 17. It will be appreciated that although these methods each illustrate a number of blocks and/or features, not all of these blocks and/or features are necessarily required, and other un-illustrated blocks, and/or features may also be present. Also, the ordering of the blocks in some embodiments can vary from what is illustrated in these figures.

The manufacturing processes of blocks 1710-1730 of method 1700 are performed in advance. Since the relevant manufacturing details are similar to those described above with respect to blocks 110-130 of method 100 and FIGS. 7 and 8, and thus a detail description thereof is dispensed herewith for the sake of brevity.

After block 1730, method 1700 proceeds to block 1740 where the insulating nanotube 214 and the m-CNT 216 of the nanotube structure 210 not covered by the gate electrode 810 are etched, exposing the s-CNT 212. Referring to the example of FIG. 18, in some embodiments of block 1740, after the gate electrode 810 is formed over the nanotube structure 210, portions of the nanotube structures 210 at the opposite sides of the gate electrode 810 are exposed by the gate electrode 810.

Figure 19:
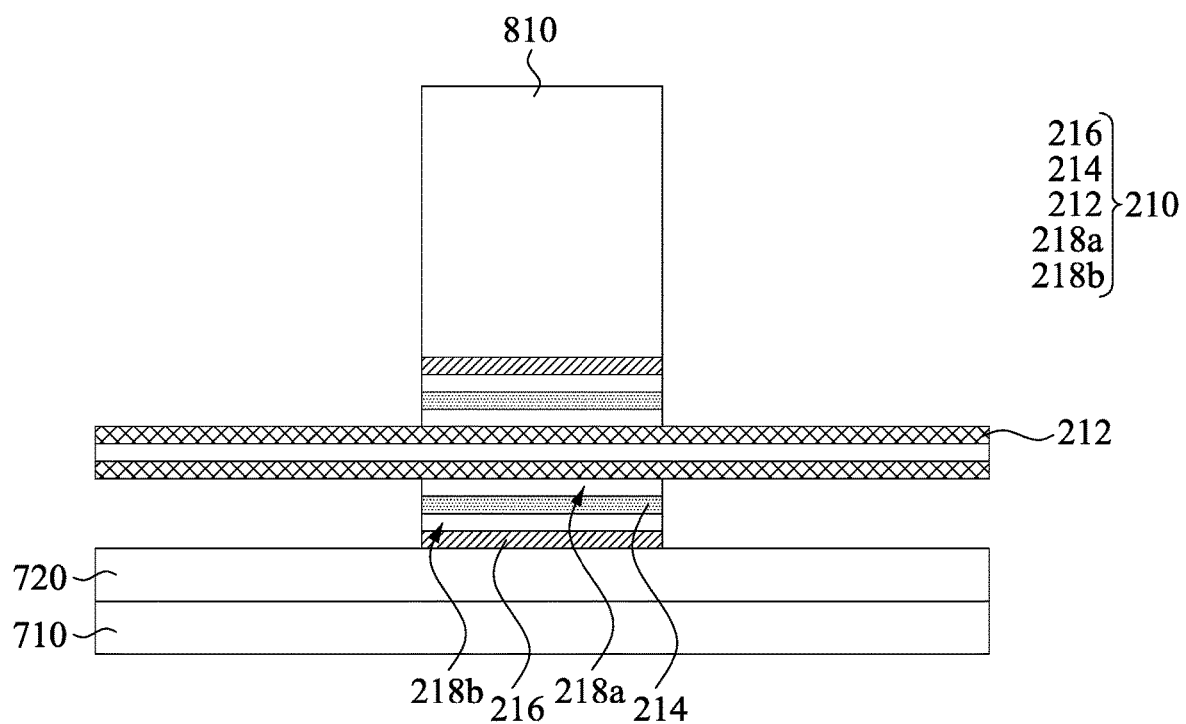
Figure 20:
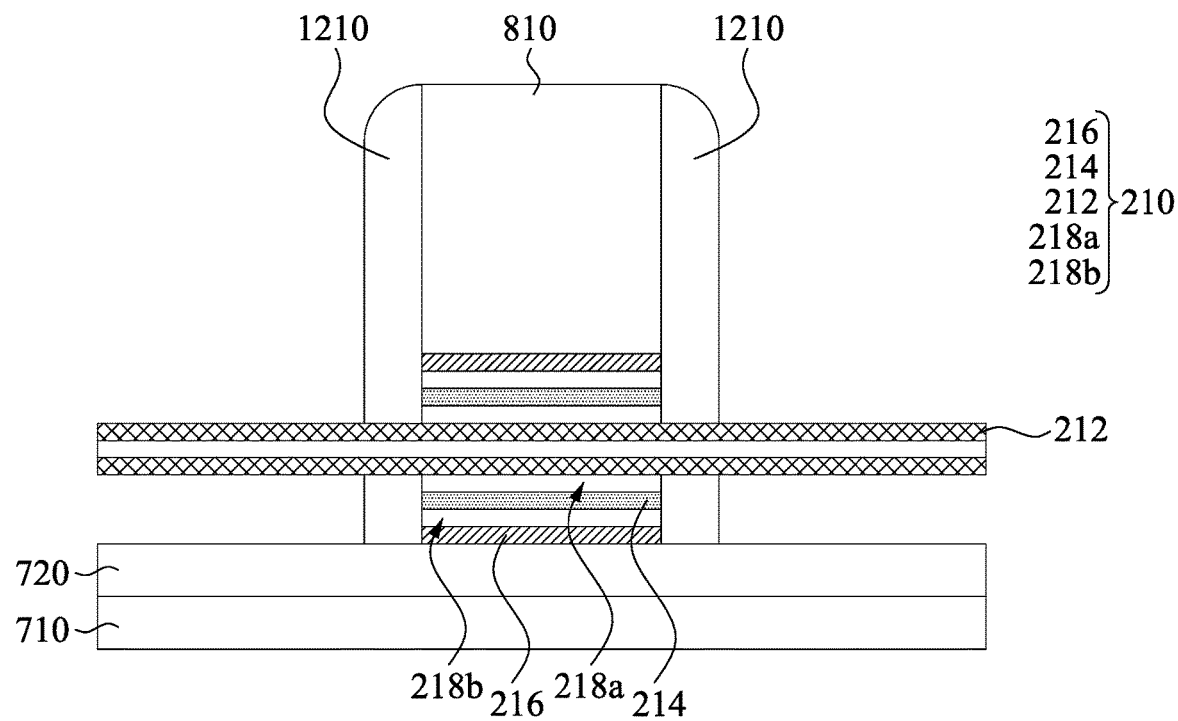
Figure 21:
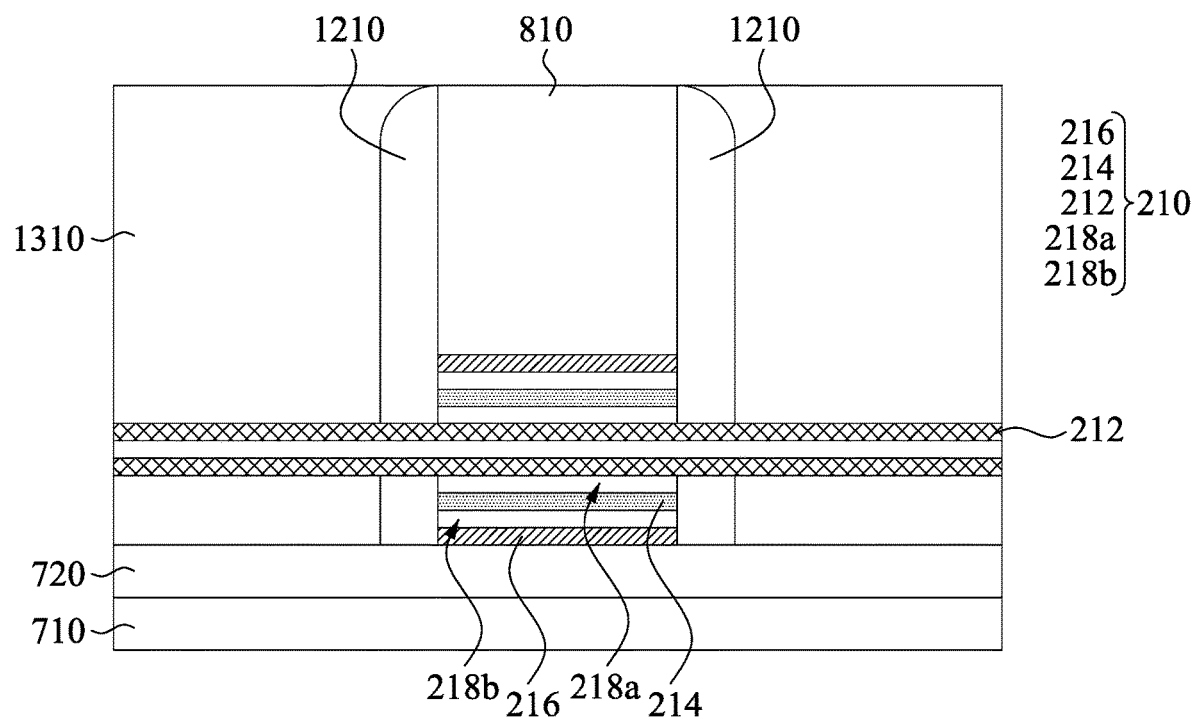

Thereafter, referring to the example of FIG. 19, the m-CNT 216 and the insulating nanotube 214 of the nanotube structure 210 are removed, exposing the s-CNT 212 of the nanotube structure 210. In some embodiments, the insulating nanotube 214 and the m-CNT 216 are removed at the same time. In other embodiments, the m-CNT 216 is removed first and then the insulating nanotube 214 is removed. The m-CNT 216 and the insulating nanotube 214 are removed by an etching process, such as lithography, RIE, or other suitable process, with the gate electrode 810 being used as a mask. As such, portions of the s-CNT 312 of the nanotube structure 210 at the opposite sides of the gate electrode 810 are exposed by the gate electrode 810.

The method 1700 proceeds to block 1750 where the spacers 1210 are formed on sidewalls of the gate electrode 810. Referring to the example of FIG. 20, in some embodiments of block 1750, after the insulating nanotube 214 and the m-CNT 216 of the nanotube structure 210 are removed, the spacers 1210 are formed on sidewalls of the gate electrode 810 and surround the s-CNT 212 of the nanotube structure 210. In some embodiments, the spacers 1210 include a low-k dielectric material, such as SiN, SiON, SiOCN, SiCN, and combinations thereof. For example, the low-k dielectric material is blanket deposited over the substrate 710. The low-k dielectric material is then patterned to remove excess portion on the top surface of the gate electrode 810 and the top surface of the substrate 710, thereby, the spacers 1210 are formed on opposite side surfaces of the gate electrode 810, respectively.

The method 1700 proceeds to block 1760 where source/drain contacts 1610 are formed on the s-CNT 212 of the nanotube structure 210. Referring to the example of FIG. 21, in some embodiments of block 1760, the ILD layer 1310 is formed over the support layer 720, surrounds and in contact with the s-CNT 212 of the nanotube structure 210. In some embodiments, the materials of the ILD layer 1310 include compounds comprising Si, 0, C and/or H, such as silicon oxide, SiCOH and SiOC. In other embodiments, organic materials, such as polymers, may be used for the ILD layer 1310. After the ILD layer 1310 is formed, a planarization operation, such as CMP, is performed, so that the top surface of the gate electrode 810 is exposed by the ILD layer 1310.

Figure 22:
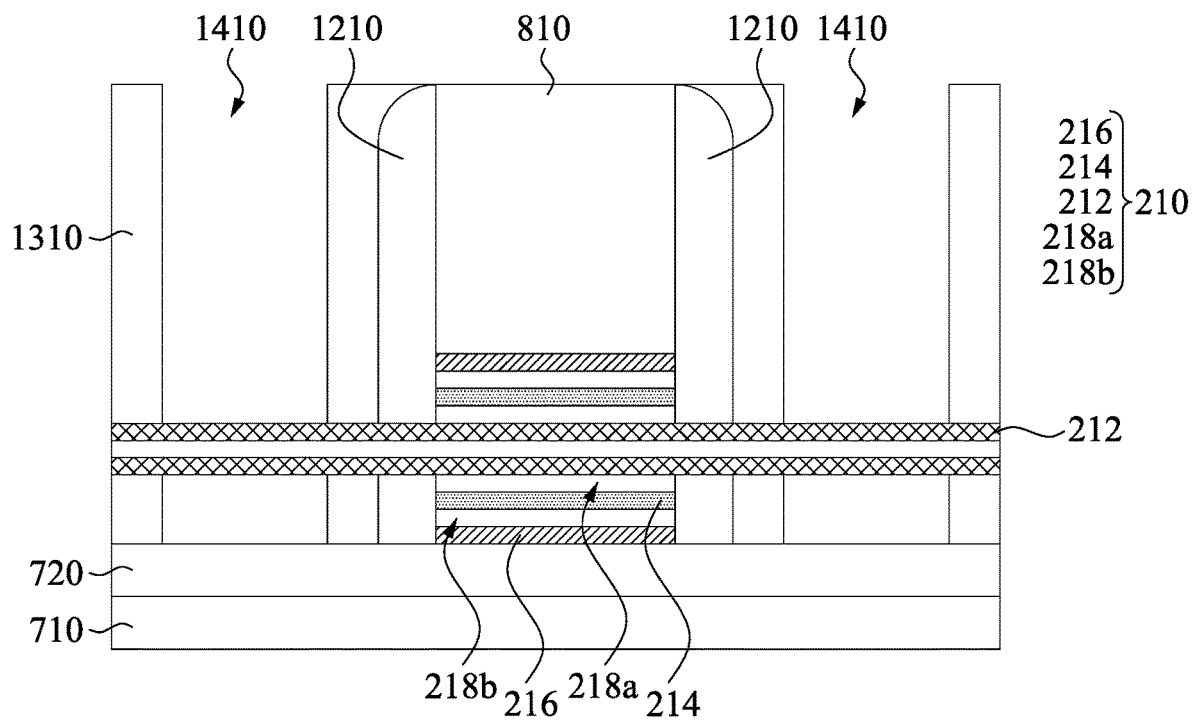

Referring to the example of FIG. 22, in some embodiments of block 1760, the ILD layer 1310 is etched by using lithography, RIE, or other suitable process to expose the s-CNT 212 of the nanotube structure 210 at opposite sides of the gate electrode 810 to form first and second openings 1410 in the ILD layer 1310 at sides of the spacers 1210 not covered by the gate electrode 810, respectively.

Figure 23:
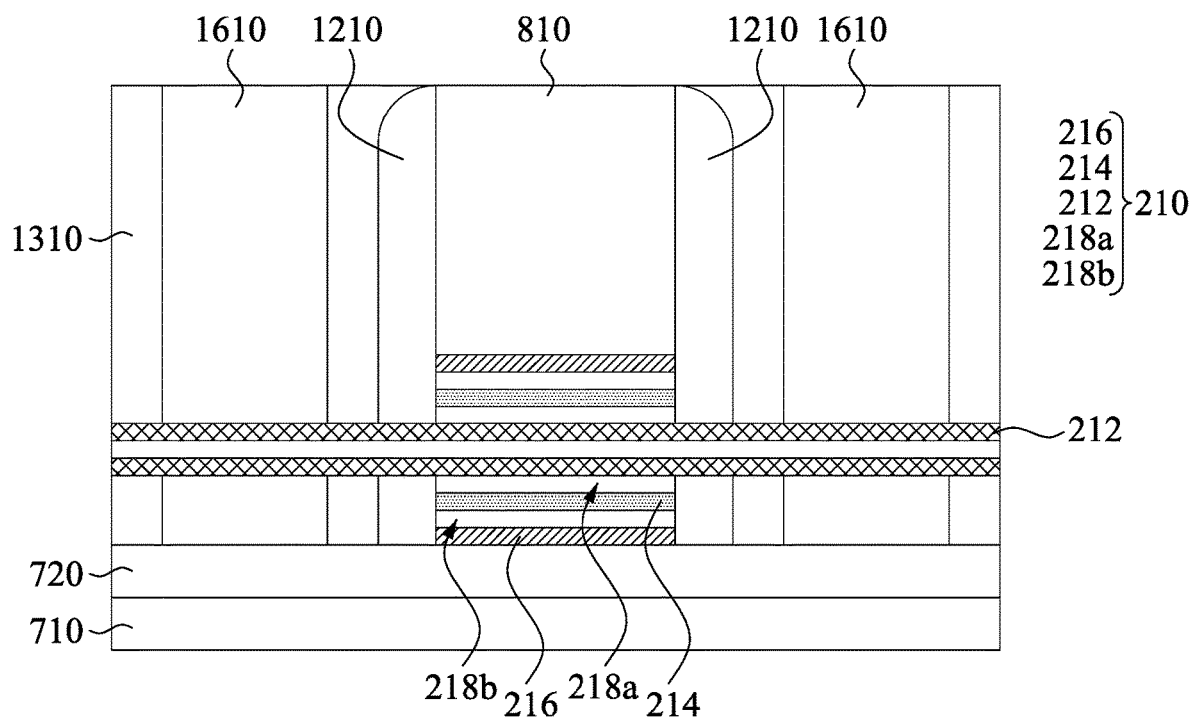

Thereafter, referring to the example of FIG. 23, the first and second source/drain contacts 1610 are formed in the first and second openings 1410, respectively. The first and second source/drain contacts 1610 may be formed by filling the first and second openings 1410 with one or more layers of a conductive material. The conductive material includes one or more of W, Cu, Ti, Ag, Al, TiAl, TiAlN, TaC, TaCN, TaSiN, Mn, Co, Pd, Ni, Re, Ir, Ru, Pt, and Zr, or any other suitable conductive materials.

The semiconductor device may undergo further processing to form various features and regions known in the art. For example, subsequent processing may form various contacts/vias/lines and multilayers interconnect features (e.g., metal layers and interlayer dielectrics) on the semiconductor device as illustrated in FIG. 23, configured to connect the various features to form a functional circuit that may include one or more devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure.

Figure 24:
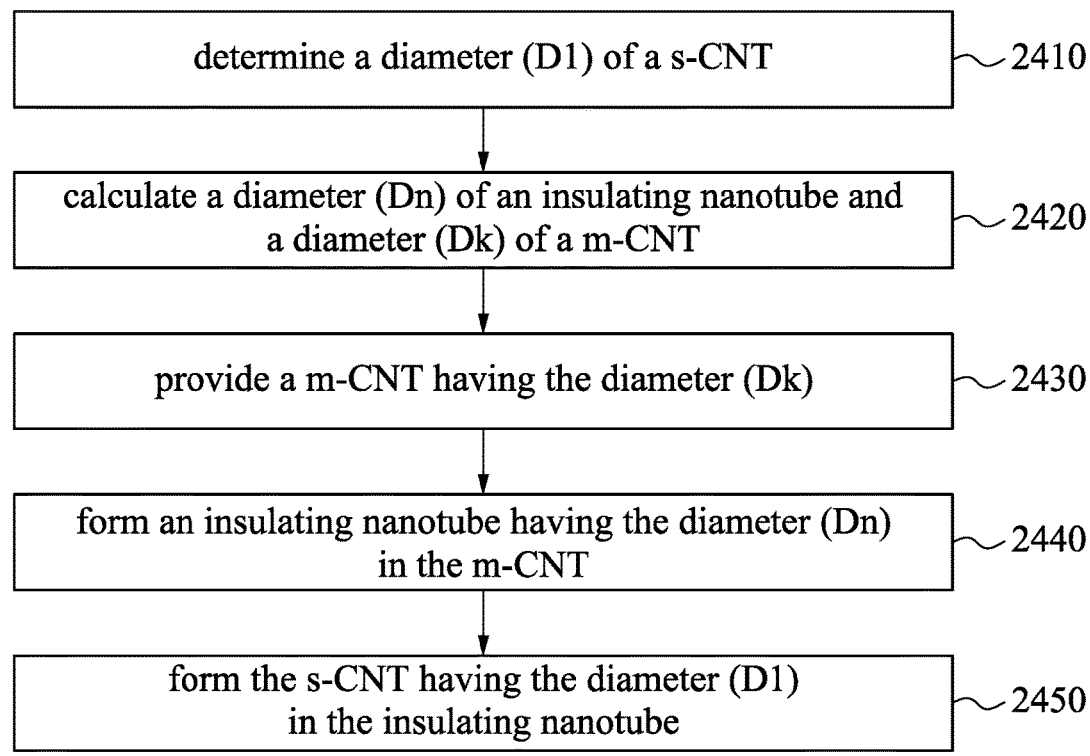
FIG. 24 is a flow chart illustrating a method of providing a nanotube structure in accordance with some embodiments of the present disclosure.
Figure 25:
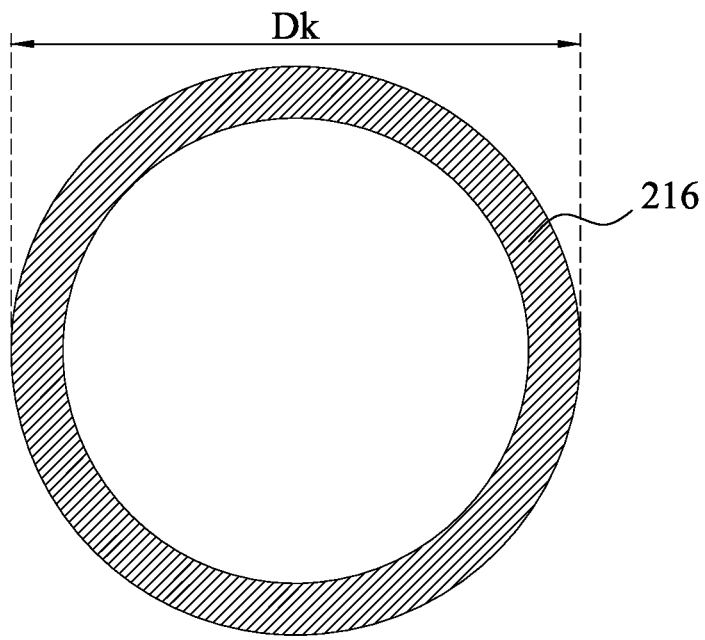
FIGS. 25-27 are cross-sectional views illustrating a nanotube structure at various stages of manufacturing in accordance with some embodiments of the present disclosure.
Figure 26:
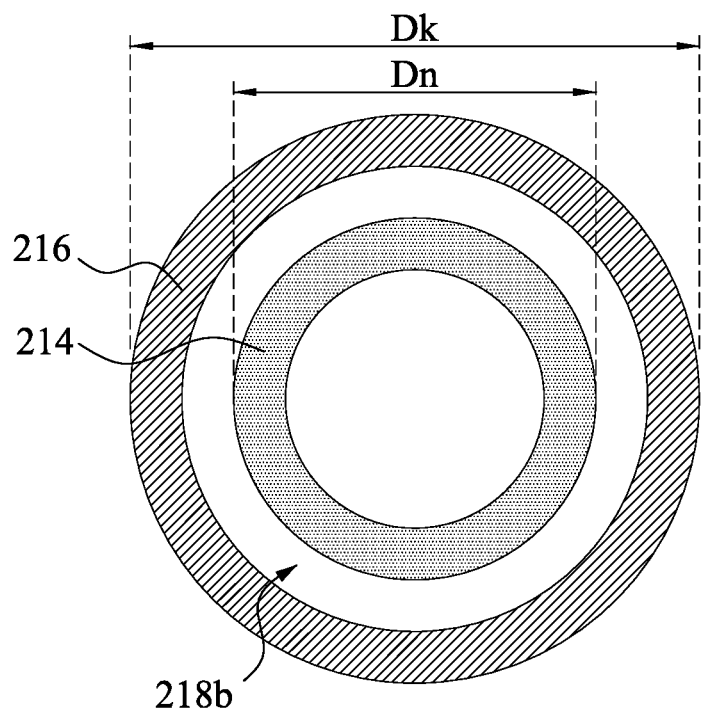
Figure 27:
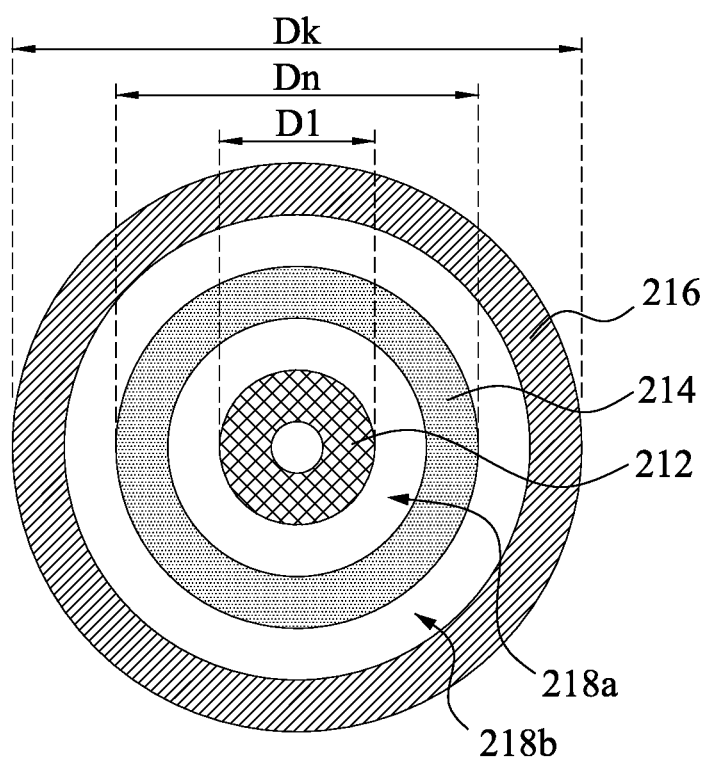

FIG. 24 is a flow chart illustrating block 110/1710 of method 100/1700 according to some embodiments of the present disclosure. As illustrated in FIG. 24, block 110/1710 includes sub-blocks 2410-2450. FIGS. 25-27 illustrate a series of cross-sectional views of a nanotube structure at various stages according to aspects of sub-blocks 2410-2450. It will be appreciated that although block 110/1710 illustrates a number of sub-blocks and/or features, not all of these sub-blocks and/or features are necessarily required, and other un-illustrated sub-blocks, and/or features may also be present. Also, the ordering of the sub-blocks in some embodiments can vary from what is illustrated in these figures.

The block 110/1710 begins at sub-block 2410 where the outer diameter (D1) of the s-CNT 212 of the nanotube structure 210 is determined. After the outer diameter (D1) of the s-CNT 212 is determined, the block 110/1710 proceeds to sub-block 2420 where the outer diameter (Dn) of the insulating nanotube 214 and the outer diameter (Dk) of the m-CNT 216 are calculated based on eq. (2) and eq. (3) described above.

The block 110/1710 proceeds to sub-block 2430 where the m-CNT 216 having the outer diameter (Dk) is provided. Referring to the example of FIG. 25, in some embodiments of sub-block 2430, the m-CNT 216 can be formed by various methods, such as arc-discharge or laser ablation methods.

The block 110/1710 proceeds to sub-block 2440 where the insulating nanotube 214 is formed in the m-CNT 216 such that the insulating nanotube 214 has the outer diameter (Dn) calculated in sub-block 2420, thereby forming the second interface 218b. Referring to the example of FIG. 26, in some embodiments of sub-block 2440, precursor molecules containing insulating materials are encapsulated first in the m-CNT 216 followed by a heat treatment (e.g., annealing). The precursor molecules use the confined space of the m-CNT 216 as a template to form the insulating nanotube 214 in the m-CNT 216. In some embodiments, the precursor molecules of the insulating nanotube 214 includes material arranged in one dimensional array, such as ammonia borane complexes (ABC), 2,4,6-trichloroborazine ($B_3Cl_3H_3N_3$), or the like. In such some embodiments, the insulating nanotube 214 may be referred as a boron nitride nanotube (BNNT).

The heat treatment of sub-block 2440 is performed at a first temperature greater than room temperature. In some embodiments, the first temperature is in a range from about 300° C. to about 650° C. In other embodiments, the first temperature is in a range from about 1300° C. to about 1500° C.

The block 110/1710 proceeds to sub-block 2450 where the s-CNT 212 is formed in the insulating nanotube 314 such that the s-CNT 212 has the outer diameter (D1) determined in block 2410, thereby forming the first interface 218a. Referring to the example of FIG. 27, in some embodiments of sub-block 2450, carbon containing molecules, e.g. $C_{60}$-fullerene, are encapsulated in the insulating nanotube 214 surrounded by the m-CNT 216. Thereafter, the carbon containing molecules with the insulating nanotube 214 and the m-CNT 216 undergoes a heat treatment to form the s-CNT 212 in the insulating nanotube 214.

The heat treatment of sub-block 2450 is performed at a second temperature less than the first temperature and greater than room temperature. In some embodiments, the second temperature is in a range from about 400° C. to about 600° C. In other embodiments, the second temperature is in a range from about 700° C. to about 900° C.

Figure 28:
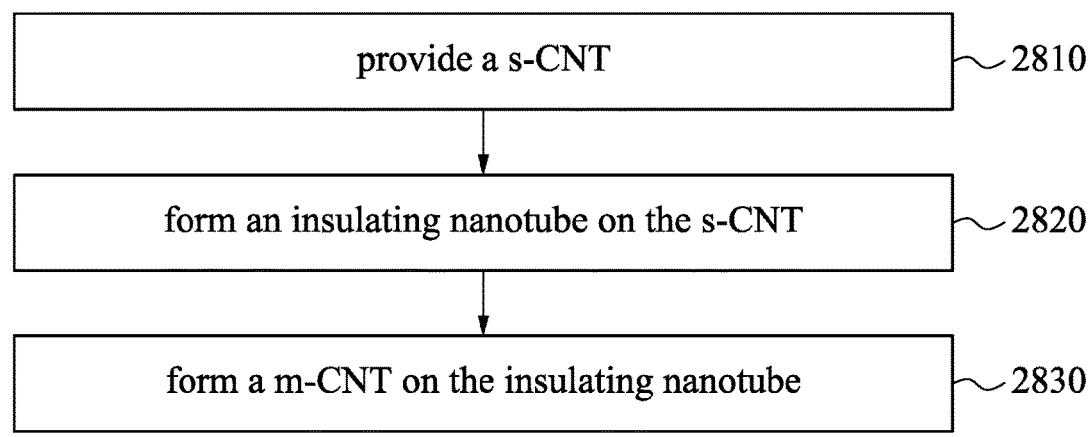
FIG. 28 is a flow chart illustrating a method of providing a nanotube structure in accordance with some embodiments of the present disclosure.
Figure 29:
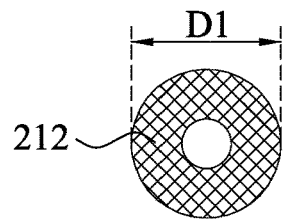
FIGS. 29-31 are cross-sectional views illustrating a nanotube structure at various stages of manufacturing in accordance with some embodiments of the present disclosure.
Figure 30:
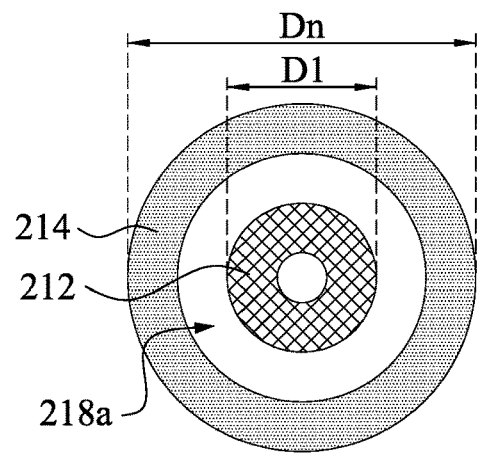
Figure 31:
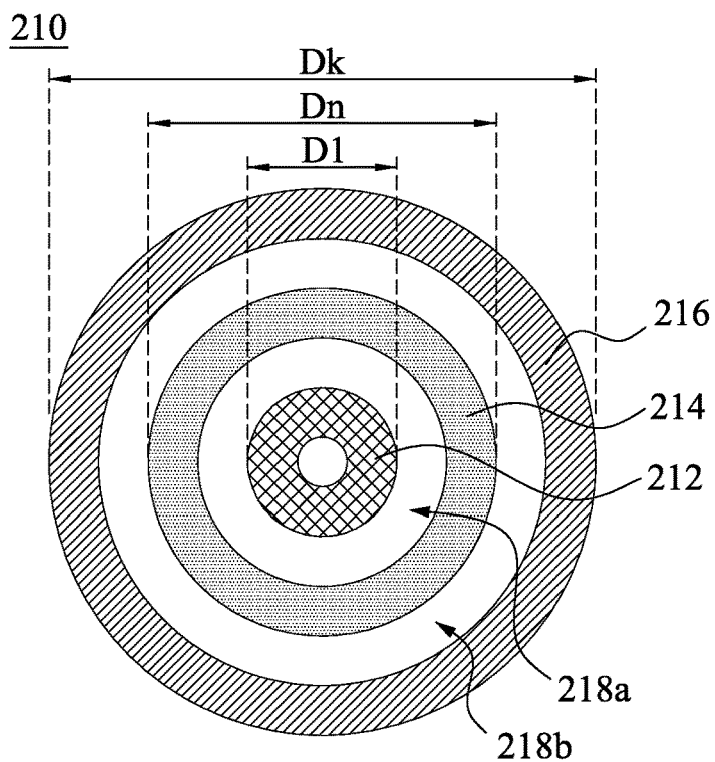

FIG. 28 is a flow chart illustrating block 110/1710 of method 100/1700 according to various embodiments of the present disclosure. As illustrated in FIG. 28, block 110/1710 includes sub-blocks 2810-2830. FIGS. 29-31 illustrate a series of cross-sectional views of a nanotube structure at various stages according to aspects of sub-blocks 2810-2830. It will be appreciated that although block 110/1710 illustrates a number of sub-blocks and/or features, not all of these sub-blocks and/or features are necessarily required, and other un-illustrated sub-blocks, and/or features may also be present. Also, the ordering of the sub-blocks in some embodiments can vary from what is illustrated in these figures.

The block 110/1710 begins at sub-block 2810 where the s-CNT 212 with the outer diameter (D1) is provided. Referring to the example of FIG. 29, in some embodiments of sub-block 2810, the s-CNT 212 can be formed by various methods, such as arc-discharge or laser ablation methods.

The block 110/1710 proceeds to sub-block 2820 where the insulating nanotube 214 is formed on the s-CNT 212 such that the first interface 218a is formed therebetween. Referring to the example of FIG. 30, in some embodiments of sub-block 2820, precursor molecules containing insulating materials are encapsulated with the s-CNT 212 in an enclosed container followed by a heat treatment (e.g., annealing) so as to use the s-CNT 212 as a template for forming the insulating nanotube 214 with the outer diameter (Dn) on the s-CNT 212, and thus the first interface 218a is formed between the s-CNT 212 and the insulating nanotube 214. The outer diameter (Dn) of the insulating nanotube 214 can be obtained using eq. (2) described above.

The heat treatment of sub-block 2820 is performed at a first temperature greater than room temperature. In some embodiments, the first temperature is in a range from about 300° C. to about 650° C. In other embodiments, the first temperature is in a range from about 1300° C. to about 1500° C.

The block 110/1710 proceeds to sub-block 2830 where the m-CNT 816 is formed on the insulating nanotube 814 such that the second interface 218b is formed therebetween. Referring to the example of FIG. 31, in some embodiments of sub-block 2830, carbon containing molecules, e.g. $C_{60}$-fullerene, are encapsulated with the s-CNT 212 surrounded by the insulating nanotube 214. Thereafter, the carbon containing molecules with the insulating nanotube 214 and the s-CNT 212 undergoes a heat treatment to form the m-CNT 216 having the outer diameter (Dk) on the insulating nanotube 214, thereby forming the second interface 218b between the insulating nanotube 214 and the m-CNT 216. The outer diameter (Dk) of the m-CNT 216 can be obtained using eq. (3) described above.

The heat treatment of sub-block 2830 is performed at a second temperature less than the first temperature and greater than room temperature. In some embodiments, the second temperature is in a range from about 400° C. to about 600° C. In other embodiments, the second temperature is in a range from about 700° C. to about 900° C.

Figure 32:
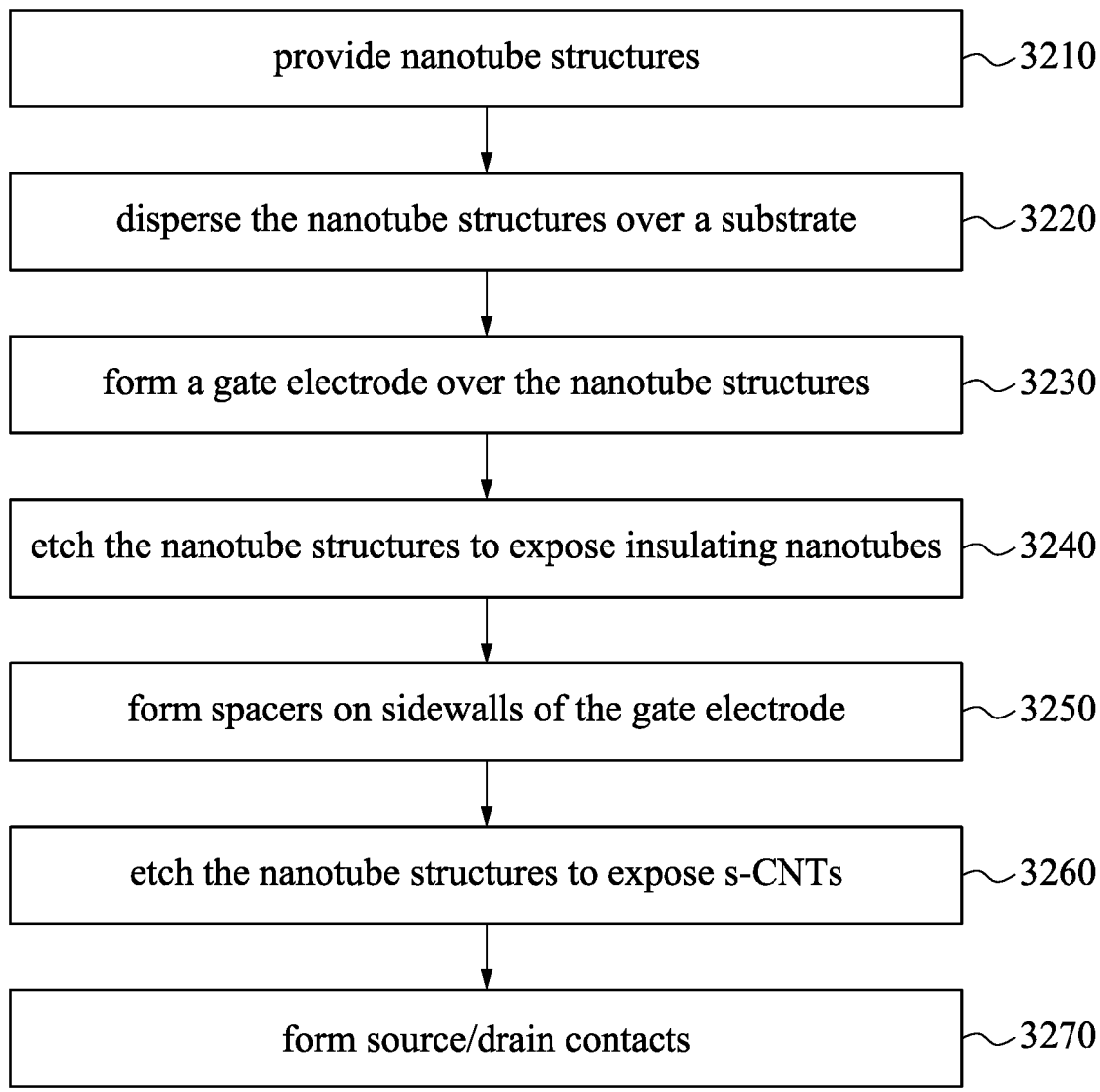
FIG. 32 is a flow chart illustrating a method of forming a semiconductor device in accordance with some embodiments of the present disclosure.

FIG. 32 is a flow chart illustrating a method 3200 of forming a semiconductor device in accordance with some embodiments of the present disclosure. Method 3200 differs from method 100 and 1700 in that, instead of the m-CNT 216, a high-k dielectric is formed surrounding the insulating nanotube 214.

As illustrated in FIG. 32, the method 3200 includes blocks 3210-3270. FIGS. 35-42 illustrate a series of cross-sectional views of a semiconductor structure at various stages according to aspects of the method 3200 of FIG. 32. It will be appreciated that although these methods each illustrate a number of blocks and/or features, not all of these blocks and/or features are necessarily required, and other un-illustrated blocks, and/or features may also be present. Also, the ordering of the blocks in some embodiments can vary from what is illustrated in these figures.

Figure 33:
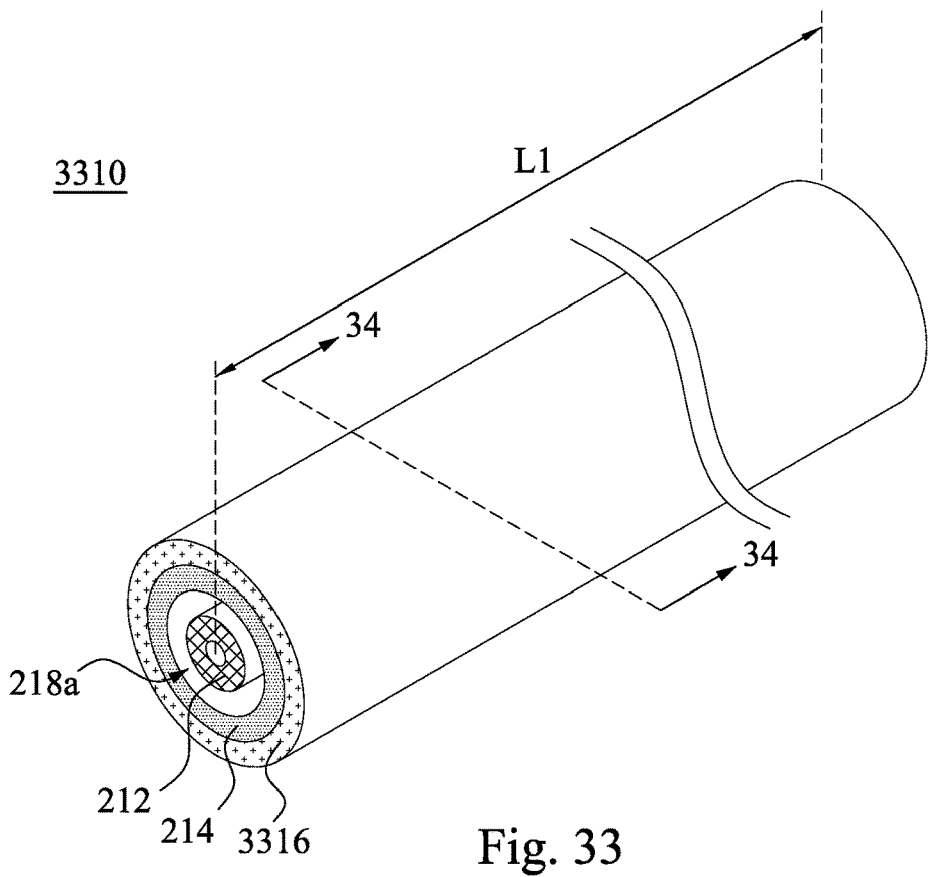
FIG. 33 is a perspective view illustrating a nanotube structure in accordance with some embodiments of the present disclosure.

The method 3200 begins at block 3210 where a plurality of nanotube structures is provided. FIG. 33 illustrates a perspective view of a nanotube structure 3310 in accordance with some embodiments of the present disclosure. Referring to the example of FIG. 33, in some embodiments of block 3210, the nanotube structure 3310 includes a s-CNT 212, an insulating nanotube 214 surrounding the s-CNT 212, a first interface 218a between the s-CNT 212 and the insulating nanotube 214, and a dielectric nanotube 3316 surrounding and in contact with an outer surface of the insulating nanotube 214.

In an embodiment, as will be described below in detail, the insulating nanotube 214 and the dielectric nanotube 3316 may together serve as a gate dielectric of a gate structure of a transistor. In such an embodiment, the s-CNT 212 at opposite sides of the gate dielectric may serve as first and second source/drain regions of the transistor, respectively.

The s-CNT 212 includes carbon, and the s-CNT 212 has a surface that is inert, e.g., both or at least one of inner and outer surfaces of the s-CNT 212 are inert. The insulating nanotube 214 has an inert surface, e.g., both or at least one of inner and outer surfaces of the insulating nanotube 214 are inert. Example of materials for the insulating nanotube 214 includes BN, AlN, or other suitable material that has an inert surface when formed on the s-CNT 212. As such, the first interface 218a is substantially free of dangling bonds. For example, the density of the dangling bonds of the first interface 218a ranges from about 2/nm$^2$ to about 10/nm$^2$ in some embodiments, and from about 5/nm$^2$ to about 7/nm$^2$ in other embodiments. In certain embodiments, the density of the dangling bonds of the first interface 218a ranges from about 0/nm$^2$ to about 1/nm$^2$.

The dielectric nanotube 3316 includes high-k dielectric material, i.e. a dielectric material having a high dielectric constant, for example, greater than that of silicon dioxide (~3.9), other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the dielectric nanotube 3316 is made of $HfO_2$ for an n-channel FET, and is made of $Al_2O_3$ for a p-channel FET.

The dielectric nanotube 3316 may be formed by CVD, ALD or any suitable methods. In one embodiment, the dielectric nanotube 3316 is formed using a highly conformal deposition process such as ALD in order to ensure the formation of the dielectric nanotube 3316 having a uniform thickness around the insulating nanotube 212. In some embodiments, a lattice of the insulating nanotube 214 may be interrupted to provide nucleation sites for the deposition process of the dielectric nanotube 3316. In other embodiments, a lattice of the insulating nanotube 214 may not be interrupted.

From the above, because high-k dielectric nanotube 3316 is formed surrounding the insulating nanotube 214. As such, a leakage current of a gate structure formed using the nanotube structure 3310 of the present disclosure can be reduced.

In some embodiment, as illustrated in FIG. 33, the nanotube structure 3310 has a length (L1) in a range from about tens of nanometer to about hundreds of micrometer.

Figure 34:
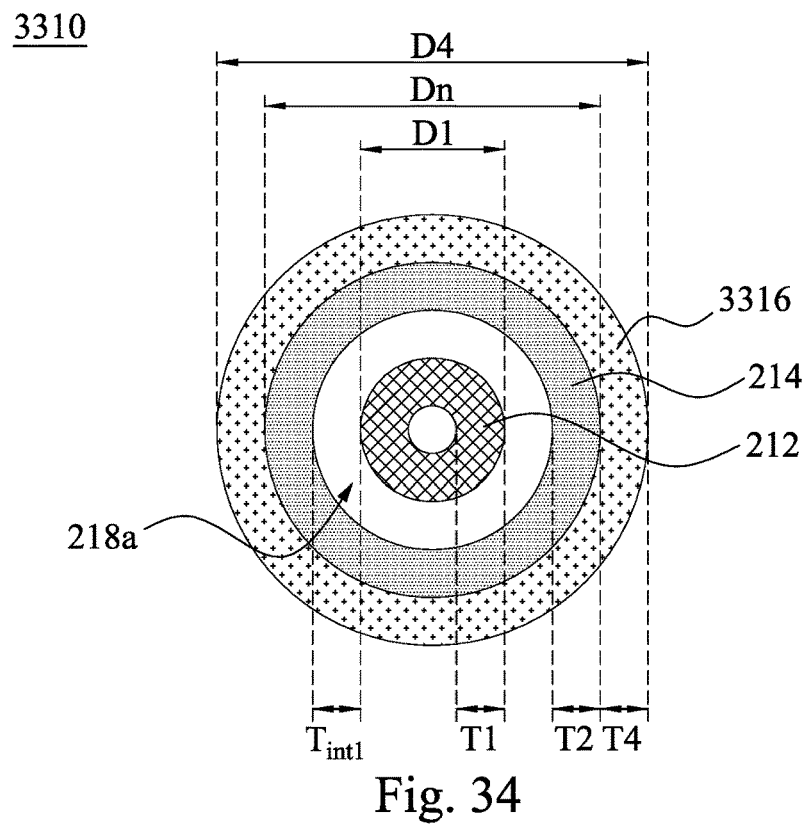
FIG. 34 is a cross-sectional view illustrating a nanotube structure in accordance with some embodiments of the present disclosure.

FIG. 34 is a cross-sectional view of the nanotube structure 3310 taken along line 34-34 in FIG. 33. Referring to the example of FIG. 34, in some embodiments, an outer diameter (D1) of the s-CNT 212 of the nanotube structure 3310 is in a range from about 0.8 nm to about 1.3 nm. The s-CNT 212 may have a band gap associated with the outer diameter of the s-CNT 212. In some embodiments, the bandgap (Eg) of the s-CNT 212 may be calculated as follows:

$$Eg=2\gamma a_{cc}/D1 \qquad \text{eq. (1)}$$

where $\gamma$ is the nearest-neighbor overlap energy, $a_{cc}$ is the length of carbon-carbon bond, and D1 is the outer diameter of the s-CNT 212.

For example, in one embodiment, the outer diameter (D1) of the s-CNT 212 of the nanotube structure 210 is about 1.1 nm. In such one embodiment, the s-CNT 212 may have a band gap of 0.8 eV.

In some embodiments, a thickness (T1) of the s-CNT 212 of the nanotube structure 3310 is in a range from about 0.30 nm to about 0.38 nm. For example, the thickness (T1) of the s-CNT 212 of the nanotube structure 3310 is about 0.34 nm.

In some embodiments, the thickness (T2) of the insulating nanotube 214 is in a range from about 0.30 nm to about 0.36 nm. For example, the thickness (T2) of the insulating nanotube 214 of the nanotube structure 3310 is about 0.33 nm.

In some embodiments, a thickness ($T_{int1}$) of the first interface 218a, i.e., the Van Der Waals gap/separation between the s-CNT 212 and the insulating nanotube 214, may be substantially the same as the thickness (T1) of the s-CNT 212. In some embodiments, the thickness of the first interface 218a is in a range from about 0.30 nm to about 0.38 nm. For example, the thickness ($T_{int1}$) of the first interface 218a is about 0.34 nm.

An outer diameter (Dn) of the insulating nanotube 214 of the nanotube structure 210 may be calculated as follows:

$$Dn(n)=D1+2nT_{int1}+2nT2 \qquad \text{eq. (2)}$$

where n is the nth layer of the insulating nanotube 214, D1 is the outer diameter of the s-CNT 212, $T_{int1}$ is the thickness of the first interface 218a, and T2 is the thickness of the insulating nanotube 214. As such, with reference to the example FIG. 34, the outer diameter (Dn) of the insulating nanotube 214 of the nanotube structure 3310 is Dn(1)=D1+$2T_{int1}$+2T2.

In some embodiments, a thickness (T4) of the dielectric nanotube 3316 of the nanotube structure 3310 is substantially greater than a thickness (T1) of the s-CNT 212. In some embodiments, the thickness (T4) of the dielectric nanotube 3316 of the nanotube structure 3310 is in a range from about 0.5 nm to about 2.5 nm. In other embodiments, the thickness (T4) of the dielectric nanotube 3316 is in a range from about 1.0 nm to about 2.0 nm.

In some embodiments, an outer diameter (D4) of the dielectric nanotube 3316 of the nanotube structure 3310 may be calculated as follows:

$$D4 = Dn(n) + 2T4 \qquad \text{eq. (4)}$$

where Dn(n) is the outer diameter of the nth layer of the insulating nanotube 214, and T4 is the thickness of the dielectric nanotube 3316. As such, with reference to the example FIG. 34, the outer diameter (D4) of the dielectric nanotube 3316 of the nanotube structure 3310 is D4=Dn(1)+2T4.

Figure 35:
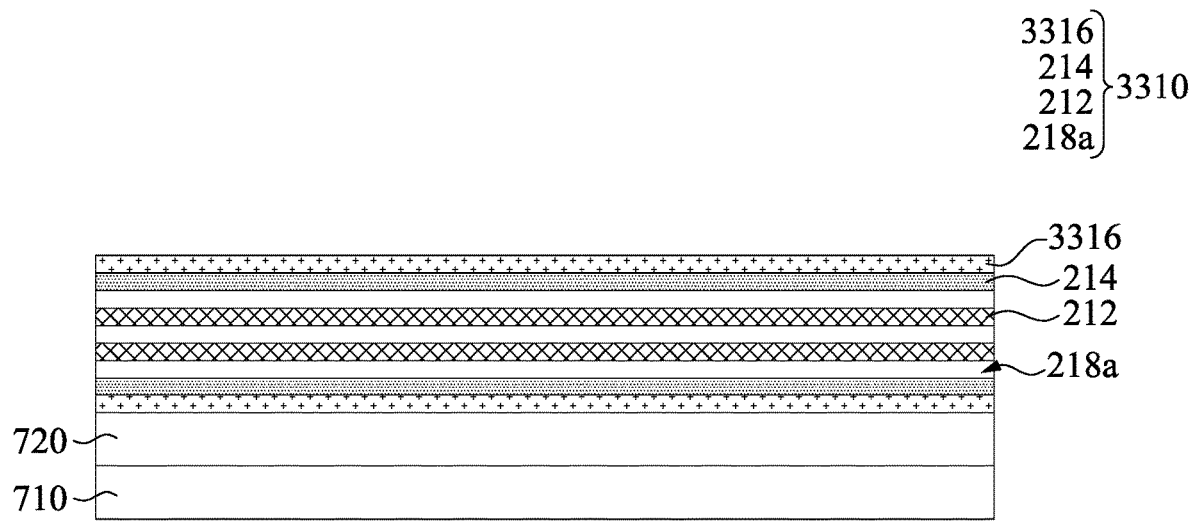
FIGS. 35-42 are cross-sectional views illustrating a semiconductor device at various stages of manufacturing in accordance with some embodiments of the present disclosure.
Figure 36:
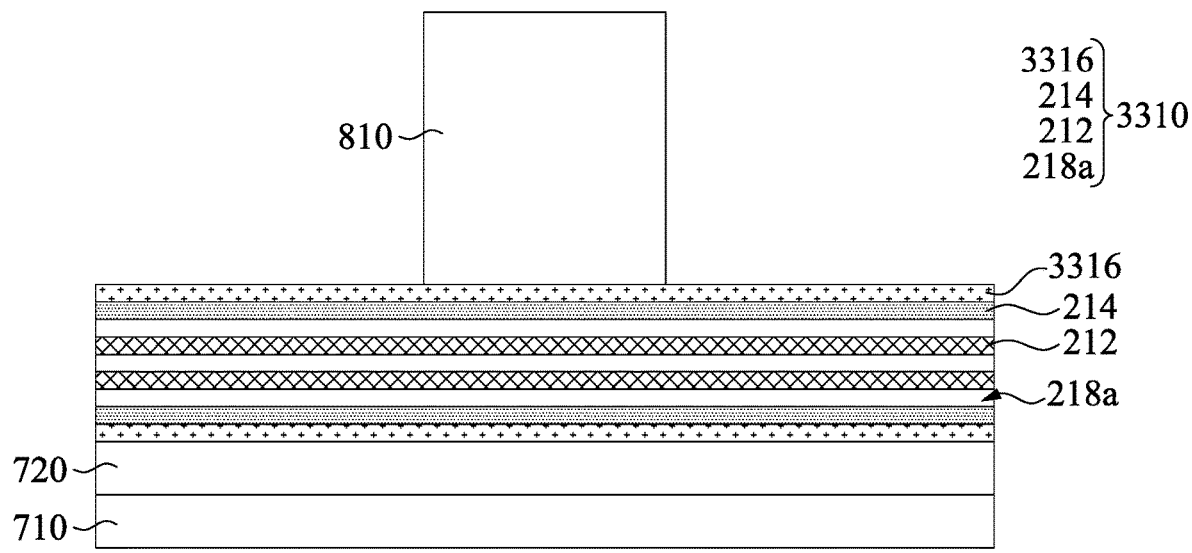
Figure 37:
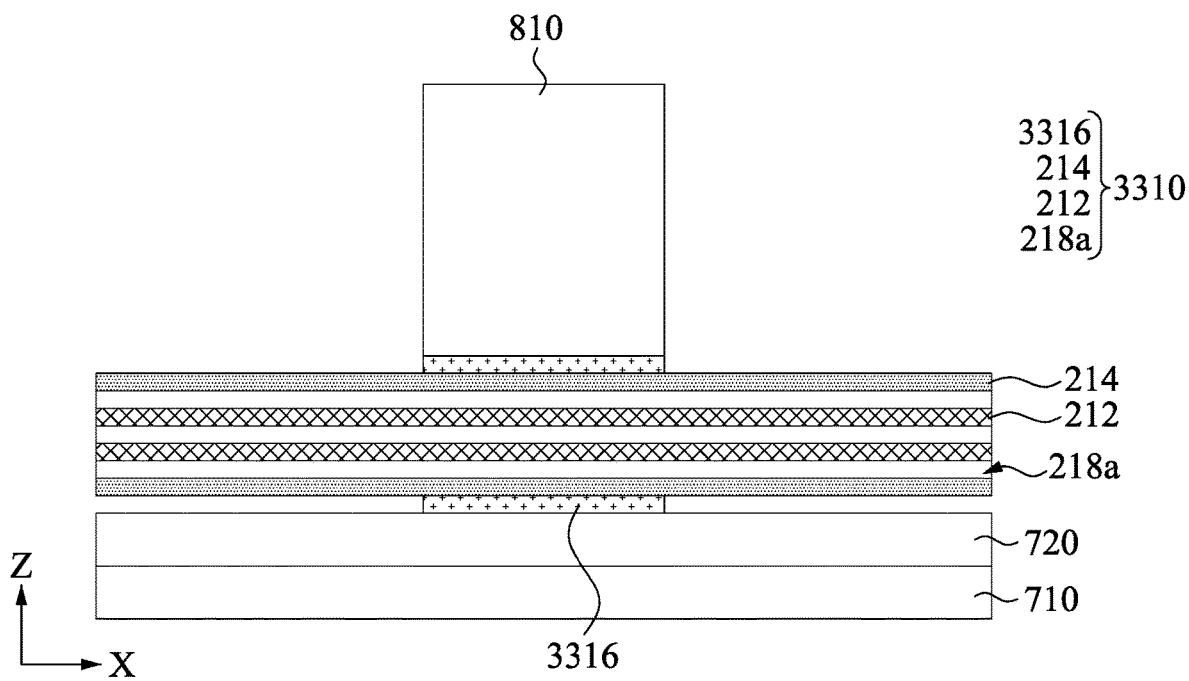
Figure 38:
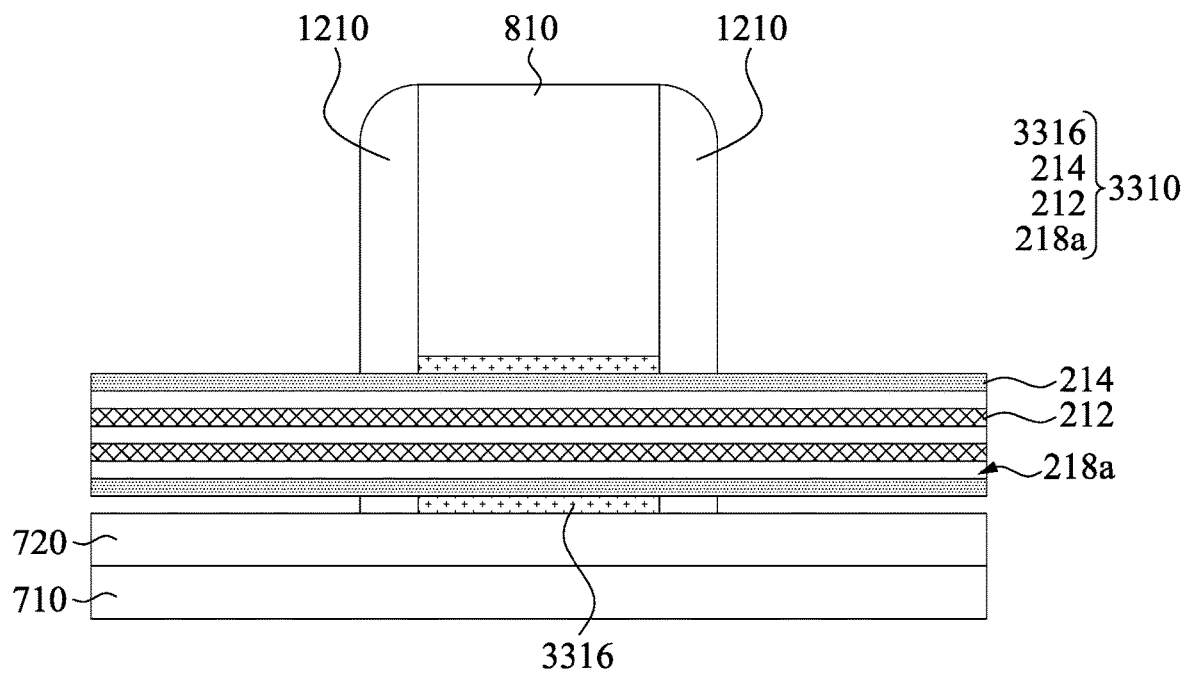
Figure 39:
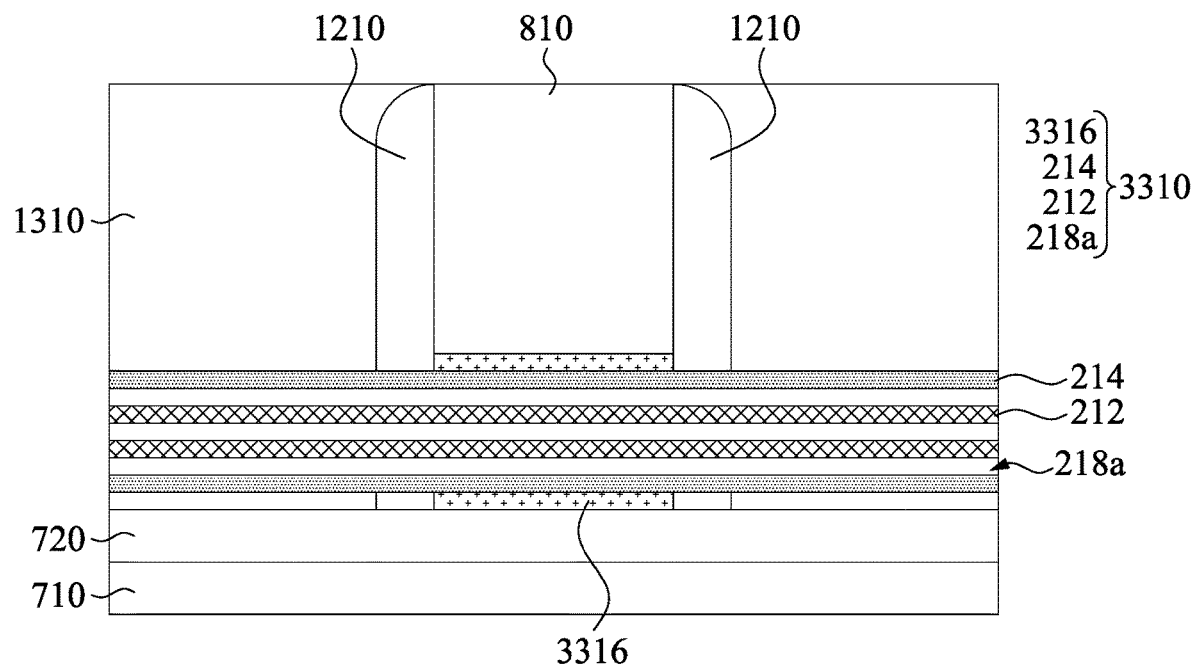

Subsequent to block 3210, the following blocks 3220-3270 of method 3200 illustrate fabrication of a transistor using the nanotube structures 3310. After block 3210, the method 3200 proceeds to block 3220 where the nanotube structures 3310 are dispersed over a substrate 710. Referring to the example of FIG. 35, in some embodiments of block 3220, the substrate 710 that is formed with a support layer 720 thereon is provided. FIG. 35 illustrates cross-sections of the substrate 710, the support layer 720, and the nanotube structure 3310 taken along the length (L1) of the nanotube structure 3310. In some embodiments, the substrate 710 is made of a suitable elemental semiconductor, such as silicon, diamond or germanium; a suitable alloy or compound semiconductor, such as Group-IV compound semiconductors (e.g., SiGe, SiC, SiGeC, GeSn, SiSn, SiGeSn), Group III-V compound semiconductors (e.g., gallium arsenide, indium gallium arsenide (InGaAs)), indium arsenide, indium phosphide, indium antimonide, gallium arsenic phosphide, or gallium indium phosphide), or the like. An insulating material, such as a glass, may be used as the substrate 710.

The support layer 720 is made from a material that insulates the nanotube structure 3310 from the substrate 710. In some embodiments, the support layer 720 includes one or more layers of silicon oxide, silicon nitride, SiON, SiOC, SiOCN and SiCN, or other suitable insulating material. In other embodiments, the support layer 720 includes a polycrystalline or amorphous material of one of Si, Ge and SiGe. The support layer 720 can be formed by suitable film formation methods, such as thermal oxidation, CVD, PVD or ALD. In certain embodiments, silicon oxide (e.g., $SiO_2$) is used as the support layer 720. The thickness of the support layer 720 is in a range from about 2 nm to about 10 nm in some embodiments, and is in a range from about 3 nm to 5 nm in other embodiments. In certain embodiments, the thickness of the support layer 720 can be larger, e.g., a few hundred nm, so long the support layer 720 can insulate the nanotube structure 3310 from the substrate 710.

Prior to or after providing the substrate 710 with the support layer 720, the nanotube structures 3310 may be placed in a solvent, Examples of solvent include, but are not limited to SDS and DCE. Subsequently, the nanotube structures 3310 are transferred onto the substrate 710 using various methods. Examples of such methods include, but are not limited to, a floating evaporative self-assembly method or other suitable methods. Thereafter, the solvent is removed from the substrate 710 by evaporation or blowing air, leaving the nanotube structures 3310 over the substrate 710. In an alternative embodiment, the substrate 710 does not include the support layer 720 and the nanotube structures 3310 are directly disposed over a top surface of the substrate 710.

After block 3220, the method 3200 proceeds to block 3230 where a gate electrode 810 is formed over the nanotube structure 3310. Referring to the example of FIG. 36, in some embodiments of block 3230, the gate electrode 810 is formed over the nanotube structure 3310 such that the gate electrode 810 is in contact with the dielectric nanotube 3316 of the nanotube structure 3310. The gate electrode 810 may be formed by ALD, PVD, CVD, e-beam evaporation, or other suitable process. Thereafter, known a lithography and RIE techniques are used to pattern the gate electrode 810. In some embodiments, the gate electrode 810 includes one or more conductive materials selected from a group consisting of W, Cu, Ti, Ag, Al, TiAl, TiAlN, TaC, TaCN, TaSiN, Mn, Co, Pd, Ni, Re, Ir, Ru, Pt, and Zr. The gate electrode 810 has a thickness in a range from about 0.5 nm to about 5.0 nm in some embodiments, and has a thickness in a range from about 0.8 nm to about 1.5 nm in other embodiments.

In some embodiments, the nanotube structures 3310 are arranged randomly over the support layer 720. In other embodiments, the nanotube structures 3310 are arranged substantially parallel to each other.

The density of the nanotube structures 3310 over the substrate 710 is in a range from about 50 tubes/μm to about 300 tubes/μm in some embodiments and in other embodiments, the density of the nanotube structures 3310 is in a range from about 100 tubes/μm to about 200 tubes/μm.

The method 3200 proceeds to block 3240 where the dielectric nanotube 3316 of the nanotube structure 3310 not covered by the gate electrode 810 is etched, exposing the insulating nanotube 214. Referring to the example of FIG. 37, in some embodiments of block 3240, after the gate electrode 810 is formed over the nanotube structures 3310, portions of the nanotube structures 3310 are exposed by the gate electrode 810. The exposed portions of the dielectric nanotube 3316 are selectively removed by an etching process, such as lithography, RIE, or other suitable process, with the gate electrode 810 being used as an etch mask. As a result, the portions of the insulating nanotube 214 at opposite sides of the gate electrode 810 are exposed.

The method 3200 proceeds to block 3250 where spacers 1210 are formed on sidewalls of the gate electrode 810. Referring to the example of FIG. 38, in some embodiments of block 3250, spacers 1210 are formed on sidewalls of the gate electrode 810 and surround the insulating nanotube 214 of the nanotube structure 3310. In some embodiments, the spacers 1210 include a low-k dielectric material, such as SiN, SiON, SiOCN, SiCN, and combinations thereof. For example, the low-k dielectric material is blanket deposited over the substrate 710. The low-k dielectric material is then patterned to remove excess portion on the top surface of the gate electrode 810 and the top surface of the substrate 710, thereby, the spacers 1210 are formed on opposite side surfaces of the gate electrode 810 respectively.

The method 3200 proceeds to block 3260 where the insulating nanotube 214 of the nanotube structure 3310 is etched to expose the s-CNTs 212 of the nanotube structure 3310. Referring to the example of FIG. 39, in some embodiments of block 3260, an ILD layer 1310 is formed over the support layer 720. In some embodiments, the materials of the ILD layer 1310 include compounds comprising Si, 0, C and/or H, such as silicon oxide, SiCOH and SiOC. In other embodiments, organic materials, such as polymers, may be used for the ILD layer 1310. After the ILD layer 1310 is formed, a planarization operation, such as CMP, is performed, so that the top surface of the gate electrode 810 is exposed by the ILD layer 1310.

Figure 40:
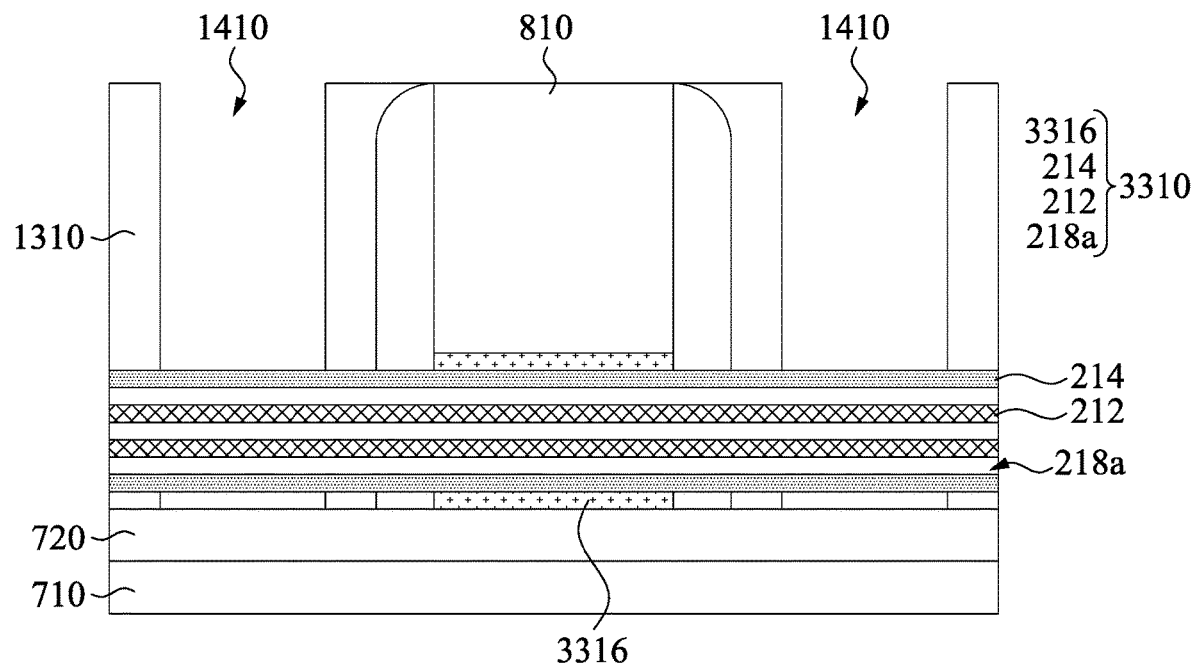

Referring to the example of FIG. 40, in some embodiments of block 3260, the ILD layer 1310 is etched by using lithography, RIE, or other suitable process to expose the insulating nanotube 214 of the nanotube structure 210 at opposite sides of the gate electrode 810 to form first and second openings 1410 in the ILD layer 1310 at sides of the spacers 1210 not covered by the gate electrode 810, respectively.

Figure 41:
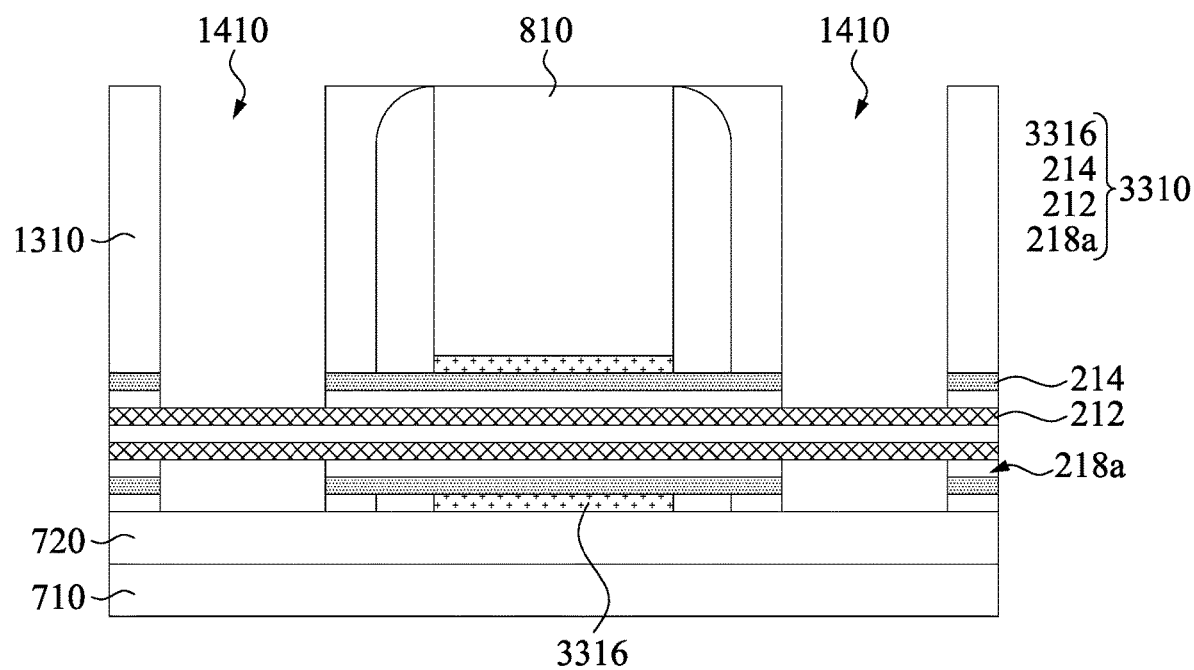

Thereafter, referring to the example of FIG. 41, the insulating nanotube 214 exposed by the first and second openings 1410 are removed by an etching process, such as lithography, RIE, or other suitable process, exposing the s-CNT 212 of the nanotube structure 210.

The method 3200 proceeds to block 3270 where source/drain contacts 1610 are formed in the first and second openings 1410, respectively and on the s-CNT 212 of the nanotube structure 3310. Referring to the example of FIG. 42, in some embodiments of block 3270, after the insulating nanotube 214 is etched, first and second source/drain contacts 1610 are formed in the first and second openings 1410, respectively. The first and second source/drain contacts 1610 may be formed by filling the first and second openings 1410 with one or more layers of a conductive material. The conductive material includes one or more of W, Cu, Ti, Ag, Al, TiAl, TiAlN, TaC, TaCN, TaSiN, Mn, Co, Pd, Ni, Re, Ir, Ru, Pt, and Zr, or any other suitable conductive materials.

Figure 42:
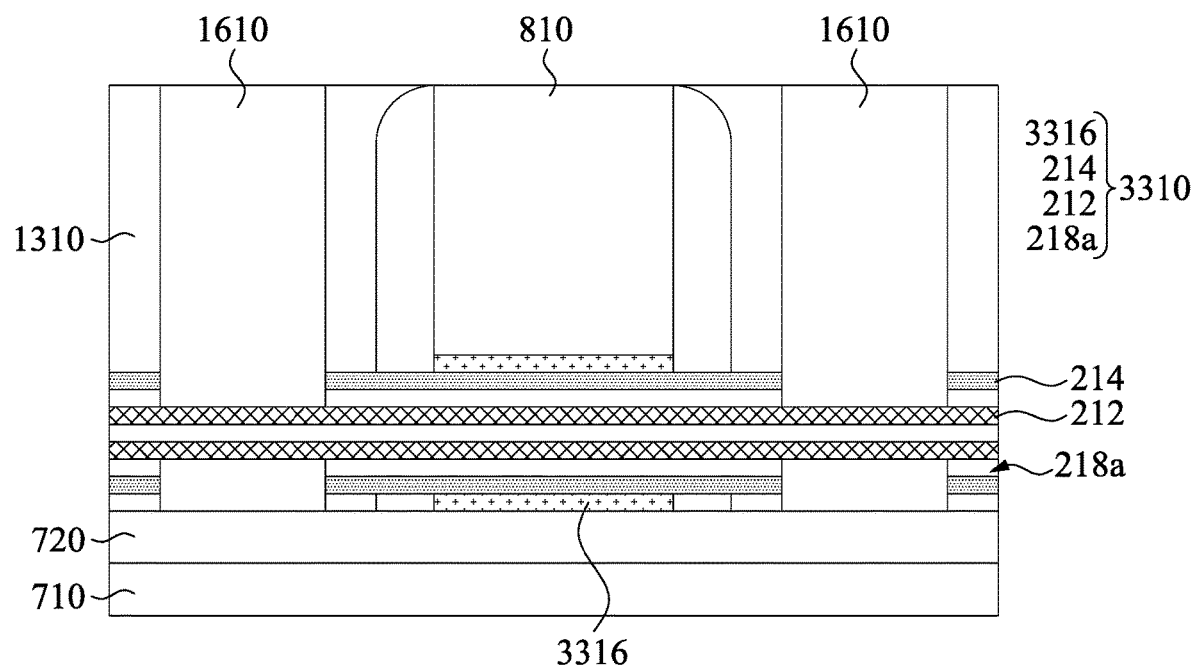

The semiconductor device may undergo further processing to form various features and regions known in the art. For example, subsequent processing may form various contacts/vias/lines and multilayers interconnect features (e.g., metal layers and interlayer dielectrics) on the semiconductor device as illustrated in FIG. 42, configured to connect the various features to form a functional circuit that may include one or more devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure.

It will be understood that not all advantages have been necessarily discussed herein, no particular advantage is required for all embodiments or examples, and other embodiments or examples may offer different advantages. For example, in some embodiments of the present disclosure, the issue of depositing dielectric as a gate insulator on the inert surface of the CNT is eliminated by using the insulating nanotube with inert surface as the gate insulator since the insulating nanotube and the CNT can be associated with each other by van der Waals force. In other embodiment, the GAA carbon nanotube structures avoid the performance degradation associated with randomly or regularly placed CNT network devices caused by interactions and junctions between the single wall CNTs. In the other embodiments, the GAA carbon nanotube structures are possible to be aligned with a high density on the substrate and thus results in a high density structure with high on-current characteristics.

According to some embodiments, a semiconductor device includes a substrate, a nanotube structure, and a gate structure. The nanotube structure is disposed over the substrate. The nanotube structure includes a s-CNT and a first insulating nanotube. The first insulating nanotube has an inert surface on the s-CNT. The gate structure includes a first m-CNT over the nanotube structure.

According to some embodiments, a semiconductor device includes a substrate, a nanotube structure, and a gate structure. The nanotube structure is disposed over the substrate. The nanotube structure includes a s-CNT and an insulating nanotube. The insulating nanotube is on the s-CNT. The gate structure includes a gate dielectric layer and a gate electrode. The gate dielectric layer is on the insulating nanotube. The gate electrode is over the gate dielectric layer.

According to some embodiments, a method of manufacturing a semiconductor device, wherein the methods includes dispersing a plurality of nanotube structures over a substrate, forming a gate structure over the nanotube structure, and forming a pair of source/drain electrodes at opposite sides of the gate structure. Each of the nanotube structures includes a first nanotube, a second nanotube on the first nanotube.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate;
   a nanotube structure over the substrate and including:
      a semiconducting carbon nanotube (s-CNT) nanotube; and
      a first insulating nanotube having an inert surface on the s-CNT; and
   a gate structure including a first metallic carbon nanotube (m-CNT) over the nanotube structure.

2. The semiconductor device of claim 1, wherein the first insulating nanotube has an inert surface.

3. The semiconductor device of claim 1, wherein the first insulating nanotube is a nitride of a Group 3A material.

4. The semiconductor device of claim 1, wherein the nanotube structure further includes a second insulating nanotube between the gate structure and the first insulating nanotube.

5. The semiconductor device of claim 1, wherein the nanotube structure further includes a second m-CNT between the first insulating nanotube and the first m-CNT.

6. The semiconductor device of claim 1, wherein the first m-CNT has a different structure than the s-CNT.

7. The semiconductor device of claim 1, wherein an interface between the first m-CNT and the first insulating nanotube is substantially free of dangling bonds.

8. The semiconductor device of claim 1, wherein an interface between the s-CNT and the first insulating nanotube is substantially free of dangling bonds.

9. A semiconductor device, comprising:
   a substrate;
   a nanotube structure over the substrate and including:
      a semiconducting carbon nanotube (s-CNT); and
      an insulating nanotube on the s-CNT and being a nitride of a Group 3A material; and
   a gate structure including:
      a gate dielectric layer on the insulating nanotube; and
      a gate electrode over the gate dielectric layer.

10. The semiconductor device of claim 9, wherein the insulating nanotube has an inert surface.

11. The semiconductor device of claim 9, wherein an interface between the s-CNT and the insulating nanotube is substantially free of dangling bonds.

12. The semiconductor device of claim 9, wherein the gate dielectric layer is in contact with the insulating nanotube.

13. The semiconductor device of claim 9, wherein the gate dielectric layer is a high-k dielectric layer.

14. The semiconductor device of claim 9, wherein the insulating nanotube has a length greater than a length of the s-CNT.

15. A semiconductor device, comprising:
a semiconductor substrate;
an insulating layer on the semiconductor substrate;
a gate electrode over the insulating layer;
a carbon-containing nanotube extending through the gate electrode;
a first boron nitride-containing nanotube wrapping around the carbon-containing nanotube; and
a first metallic carbon-containing nanotube wrapping around the first boron nitride-containing nanotube.

16. The semiconductor device of claim 15, further comprising a second boron nitride-containing nanotube between the first boron nitride-containing nanotube and the first metallic carbon-containing nanotube.

17. The semiconductor device of claim 15, further comprising a second metallic carbon-containing nanotube wrapping around the first metallic carbon-containing nanotube.

18. The semiconductor device of claim 15, wherein the first boron nitride-containing nanotube extends past opposite two sidewalls of the gate electrode.

19. The semiconductor device of claim 15, wherein the first boron nitride-containing nanotube has a length greater than a length of the first metallic carbon-containing nanotube.

20. The semiconductor device of claim 15, wherein the first boron nitride-containing nanotube has a length substantially the same as a length of the first metallic carbon-containing nanotube.

\* \* \* \* \*